United States Patent [19]
Stroud et al.

[11] Patent Number: 5,215,608
[45] Date of Patent: Jun. 1, 1993

[54] COMPOSITION AND METHODS FOR BONDING ELECTRICAL COMPONENTS

[76] Inventors: Robert D. Stroud, 6275 Simmons Dr.; Kim Von Brandt, 1430 Blue Sage Ct., both of Boulder, Colo. 80303

[21] Appl. No.: 469,917

[22] Filed: Jan. 24, 1990

[51] Int. Cl.$^5$ ............................................. B32B 31/00
[52] U.S. Cl. ..................................... 156/64; 29/464; 156/307.3; 156/315; 156/327; 156/331.1; 360/104; 524/81
[58] Field of Search ............... 156/64, 327, 315, 307.3, 156/331.1; 524/81; 360/104; 29/464

[56] References Cited
U.S. PATENT DOCUMENTS 4,866,836  9/1989  von Brandt et al. ............... 156/64
4,920,438  4/1990  Furakawa et al. ............... 360/104

Primary Examiner—John J. Gallagher
Attorney, Agent, or Firm—Door, Carson, Sloan & Peterson

[57] ABSTRACT

Adhesive Compositions comprising a solid component of from about 60 to 90 percent of a solid resin and from about 10 to 40 percent flexible resin which are suspended in a liquid component comprised of from about 80 to 98 percent solvent and from about 2 to 20 percent curing agent and wherein the solid component comprises from about 10 to about 30 percent of the overall composition and the liquid component comprises about 70 to 90 percent of the overall adhesive composition can be used to "quick tack" electrical components in minimal amounts of time and with minimal amounts of electrical resistance between the components.

3 Claims, 8 Drawing Sheets

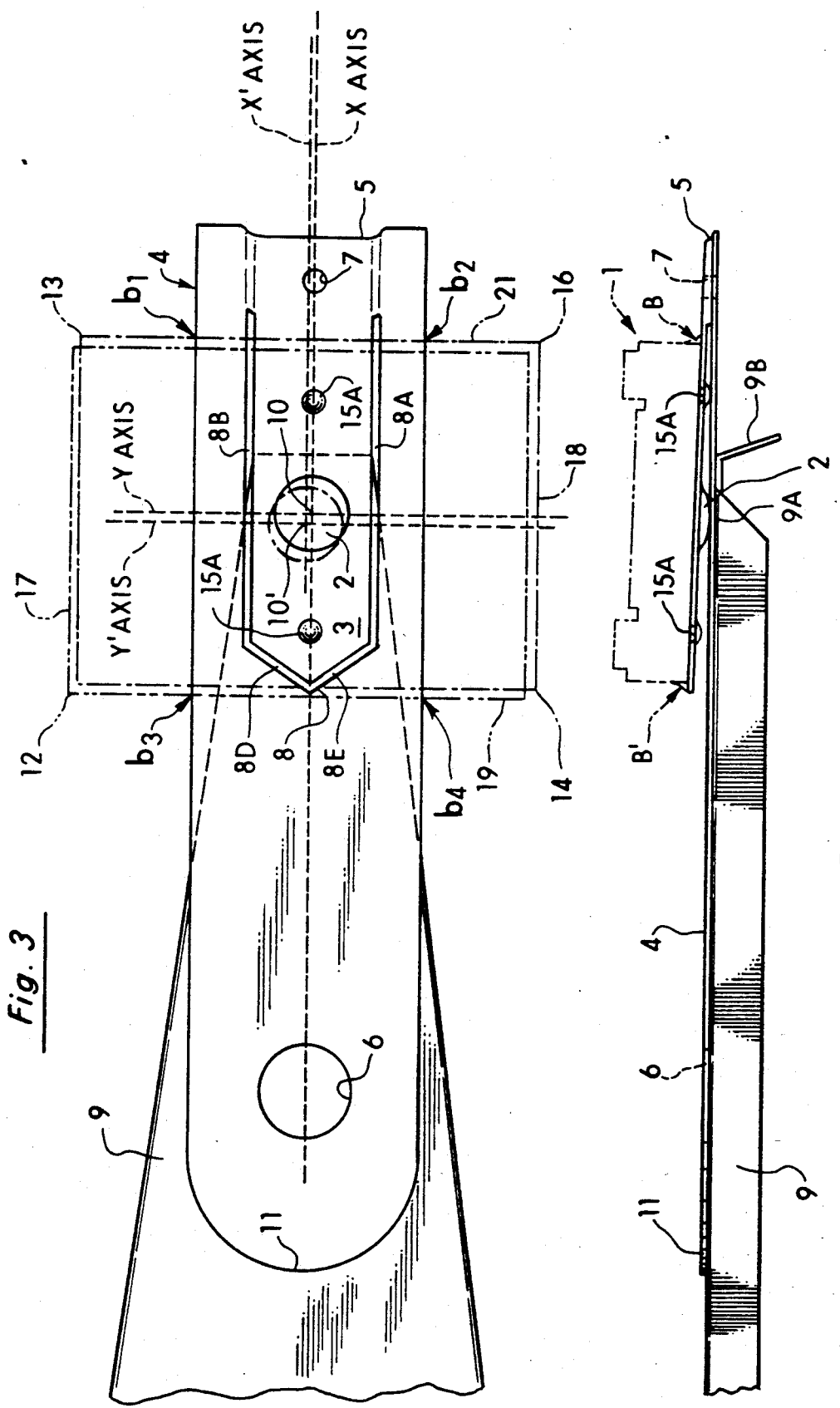

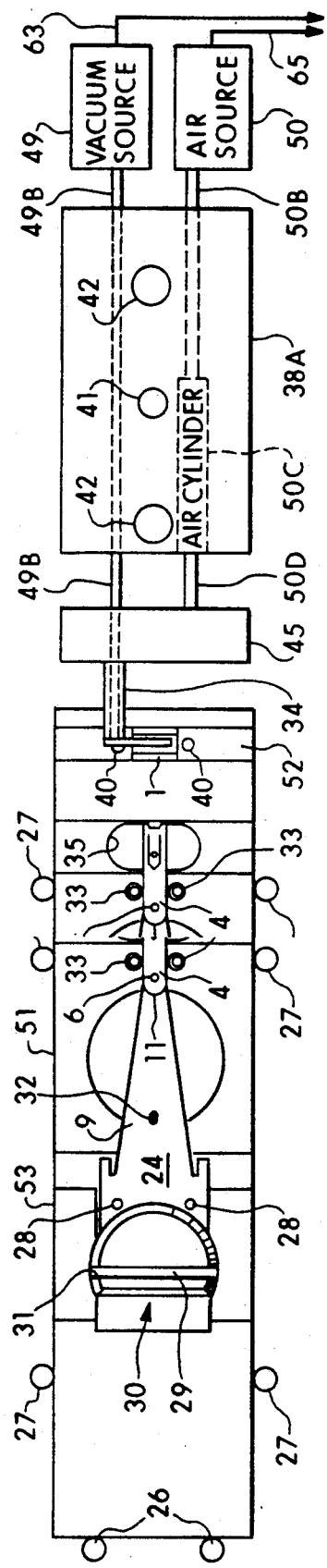
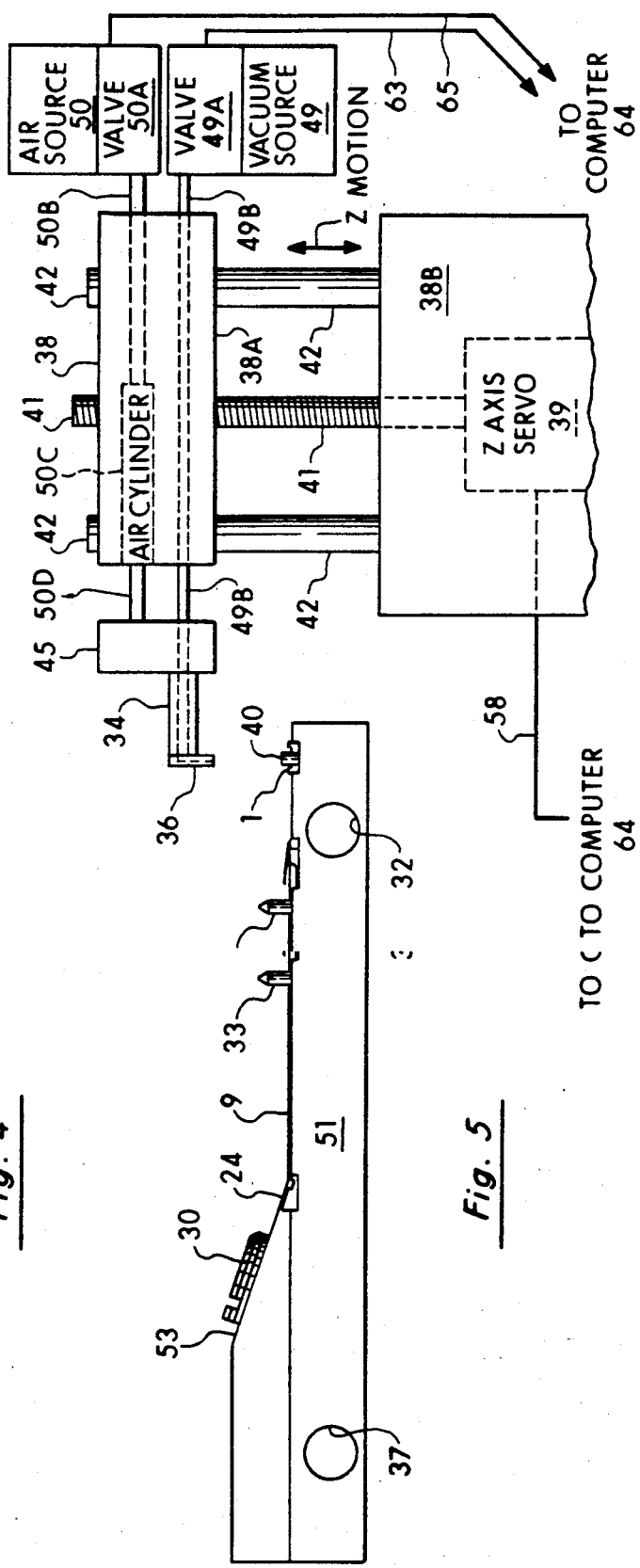
Fig. 4
Fig. 5

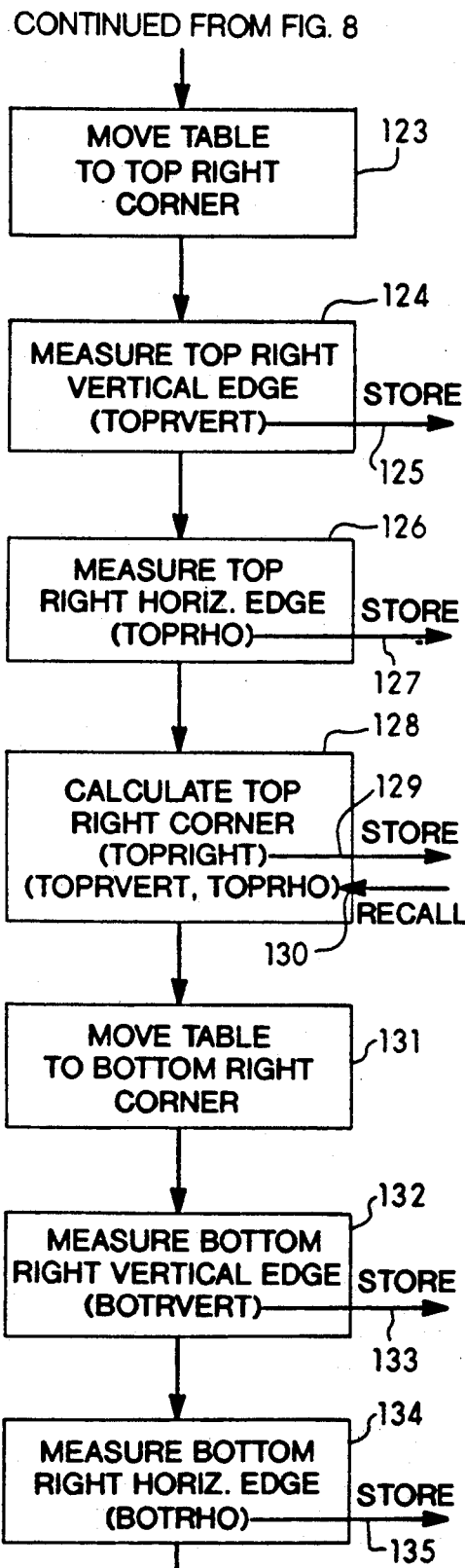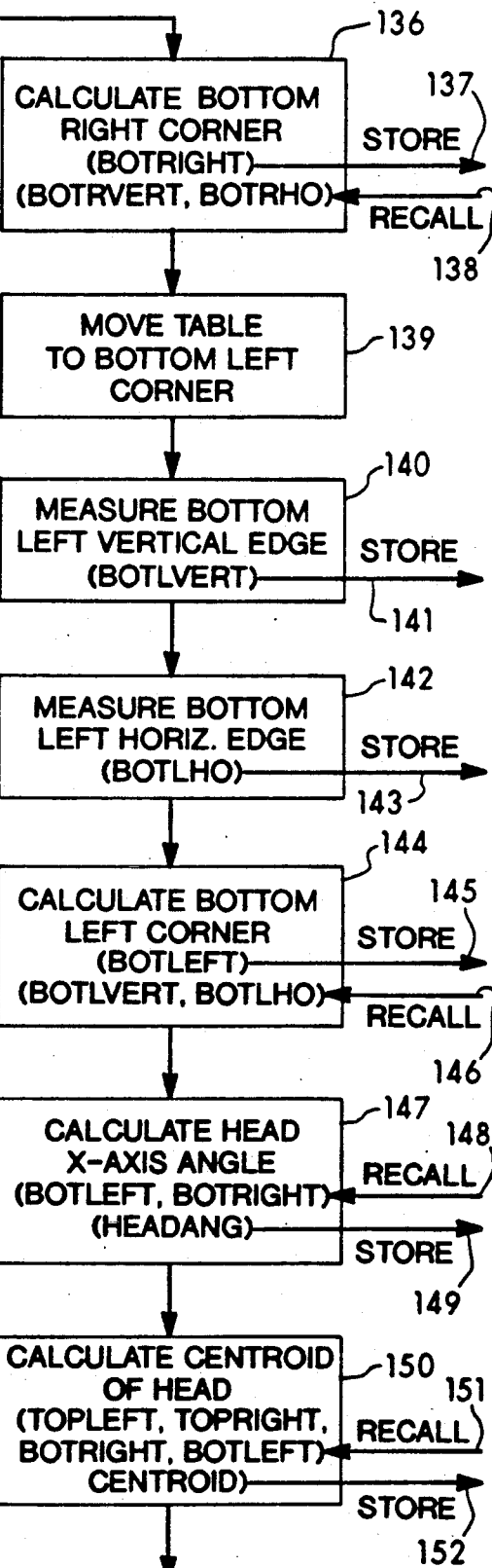
Fig. 9

COMPOSITION AND METHODS FOR BONDING ELECTRICAL COMPONENTS

FIELD OF THE INVENTION

This invention relates to compositions and methods for bonding electrical components to each other with minimal electrical resistance between said components; among other things such compositions and methods are particularly suited to mounting magnetic read/write heads on suspension assembly arms.

BACKGROUND OF THE INVENTION

Many electrical assemblies call for one component to be attached to another component with a minimum of electrical resistance between said components. Mechanical fastening may be necessary for exceptionally heavy parts, but it is unsuitable for many other uses because it complicates design, adds considerable weight and is costly. Conformal coatings are suited only for bonding very-low-mass components which are not subject to great mechanical forces. Consequently, for many applications adhesive bonding has proved to be the most feasible and economical method for securing one electrical component to another. For example, magnetic read/write heads which are extensively used in computers and other applications in which data is written onto and read from a magnetic medium such as a magnetic tape or disk are bonded onto suspension assembly arms which are computer controlled so that the head may be rapidly moved from position to position to write or read information from the portion of the medium specified by the computer. Hence, the adhesive bonds between the head and arm also must be strong. The strength requirement follows from the fact that the magnetic heads must be moved as rapidly as possible over the associated magnetic medium in order to minimize the time required for locating the correct track that is to be read or written. This rapid movement often produces acceleration and deceleration forces on the head on the order of 40 gs. This mounting job also calls for minimal electrical resistance between the read/write head and the suspension assembly arm. This requirement follows from the fact that one does not want an electrical charge such as those created by static electricity to build upon the head. Such a charge build-up on the head may cause data collection and transfer malfunctions. Hence minimal electrical resistance between the head and the suspension arm serves to prevent a build-up of a net charge on the head.

The techniques by which read/write heads are bonded to their respective suspension assembly arms are, to a large degree, dictated by the levels of precision required by the magnetic disk environment. For example, magnetic disks must be manufactured with an extremely high degree of flatness because the head is called upon to "float" on a very thin film of air just above the disks. Therefore the head is secured to a resilient suspension assembly arm in order to obtain the mobility which permits the head to float on the air film and to provide a resilient load which exerts an accurately defined pressure on the head.

Moreover, the current trend in the industry is towards higher and higher recording densities and an ever increasing numbers of tracks on the associated disks. This has led to increased miniaturization of all parts of the recording apparatus including the heads and the suspension arms to which the heads are attached. As a result, thin film heads are currently used that have dimensional tolerances on the order of several millionths of an inch. This requires that the heads be accurately positioned on the associated suspension arm so that the head may operate parallel to the plane of assembly arm as well as the plane of the disk with which it is to exchange data. In practice, the head must be positioned parallel to the plane of the disk within several thousandths of an inch in each dimension. The head must also have a minimal rotational error with respect to the magnetic orientation of the data to be read. These are all important considerations because the head is separated from the moving disk by no more than a few millionths of an inch. All this goes to say that the positioning of a read/write head on a suspension arm is extremely critical with respect to the tolerances which must be achieved if the optimum operation of the head is to be achieved. Such close tolerances and accurate positioning requires that heads be positioned with extreme precision on suspension assembly arms.

The typical prior art procedure used to affix a head to a suspension arm is to first position the suspension arm in a first tool holder. The head is placed in a second tool holder and the two tool holders are then moved in a controlled manner so that the end of the suspension arm and the head are brought together with the required orientation. The head is then permanently affixed to the end of the suspension arm. A bonding or "gluing" the head to the suspension arm has evolved as the most practical method of fabrication. One of the most common procedures is to use a dispensing device such as a syringe to lay a strip of adhesive along the junction defined by the end of a vertical face of the head and the horizontal surface defined by the top surface of the suspension arm. That is to say the strip takes the form of a fillet in the angle formed by the junction of the side of the head and the top of the suspension arm. Typically the bonding adhesive is laid along at least two of the junctions defined by say a rectangular shaped head and the flat surface of the suspension arm to which the head is mounted.

The adhesives employed for this purpose are normally epoxy resins having a high solid content ("high-solid-content adhesives"). High-solid-content adhesives of this type usually have a liquid and/or a solid component which is an epoxy resin of from at least 90 weight percent to as high as about 98 weight percent of the adhesive material. A solid curing agent can be employed in either a liquid and/or in a solid resin. Such resins are also often referred to in the literature as "100 percent solid resins". That is to say these epoxy resins are designed to cure without releasing very much moisture or other by-products. In some formulations no solvents necessary. Such 100 percent solids adhesives are employed in head/suspension arm bonding operations in order to reduce the possibility of entrapped gases, voids, and porosity in the bond line which would significantly lower bond strengths. Moreover, solvents and entrapped moisture are known to cause serious corrosion problems in metal bonding. This is the reason it is possible to bond successfully to metal with epoxies using only contact pressures, because it is unnecessary to provide for water removal (as in phenolics) and solvent removal (as in elastomer emulsions). The 100 percent solids content of epoxy also makes it convenient for rapid assembly-line bonding to nonporous surfaces such as glass and metals. Common examples of such high-solid-content adhesives include epoxy (anhydride cure), epoxy (amine cure), epoxy phenolic, epoxy polyamide and epoxy nylon formulations. Adhesives of this kind have a thick glue-like consistency and usually take several hours to completely dry at room temperature. Hence, most bonding operations of this type are speeded up by the use of heat applied to the adhesive fillet. At temperatures greater than about 400° F. these high-solid-content adhesives usually take from at least one to about three minutes to permanently set.

It should be specifically noted that these high-solid-content adhesives are not normally placed at the interface of the bottom of the head and the top surface of the suspension arm. This prohibition follows from the fact that such high-solid-content adhesives do not spread evenly and/or remain in too thick a layer and hence tend to create poor electrical contact between the bottom surface of the head and the suspension arm. Thus, as was noted above, read/write heads are typically bonded to the top of their associated suspension arms by strips of adhesive laid as fillets at the junction of the two electrical components.

This fillet bonding or gluing procedure has certain inherent problems, especially when it is applied to head/suspension arm affixing operations. Heads and arms are positioned by aligning edges and using tooling holes. These are hand positioned by an operator. As previously noted, the accuracy by which the head is positioned on the arm is dependent upon a number of variables. These include, the dimensional accuracy of the head, the accuracy of the tool that holds the arm, the accuracy of the tool that holds the head, the accuracy of the apparatus that moves the head over the arm, and finally the accuracy of the apparatus that lowers the head onto the arm. Thus, in the head positioning operation, it is necessary that the geometric center of the head be positioned with precision over a predetermined point on the assembly arm with an error of no more than plus or minus one mil in any direction and with an error of only several seconds of a degree with respect to the rotational position of the head with respect to the plane of the top surface of the assembly arm. Although the design objectives are plus or minus one mil, in a typical production line, there can be an error of five mils due tolerances of the head and the apparatus used to position the head on the suspension arm. An error of in excess of two mils can cause operational problems that require head-arm assemblies having errors in excess of this amount to be discarded. Needless to say, the equipment, such as the hereinafter described optical alignment equipment used to position and hold a read/write head upon a suspension arm while the high-solid-content adhesive is cured is extremely expensive. Hence, those skilled in this art will appreciate that any decrease in the residence time of those electrical components which are undergoing bonding in expensive equipment of this type implies great economic advantage. The adhesive formulations of this patent disclosure, as well as the methods of employing them, are aimed at improving the bonding operations associated with mounting read/write heads to suspension arms, but those skilled in this art will appreciate that the compositions and methods hereinafter described can be successfully employed in a multitude of electrical assembly situations. They are especially useful where there is a need for one electrical component to be precisely bonded to another electrical component with minimal electrical resistance between said components and with minimal amounts of residence time in the expensive equipment normally needed to achieve high levels of precision in mounting one electrical component to another.

SUMMARY OF THE INVENTION

Solutions to the above noted bonding problems and a technical advance in this art is achieved by the present invention which provides improved bonding adhesives and methods for using said adhesives. These adhesives and methods are particularly useful in those bonding operations where great precision is required and where that precision is achieved through the use of extremely expensive equipment, i.e., equipment having high capital costs. This follows from the fact that in any assembly line operation there is great economic advantage in having each component being assembled reside or otherwise be associated with any piece of expensive equipment for as short a time period as possible. Thus for example bonding operations carried out while a read/write head and a suspension arm are under the control of the hereinafter described optical alignment equipment can be carried out in less than about one-sixth the time required by methods employing the previously noted fillets of high-solid-content adhesives. Those skilled in this art also will appreciate that while the hereinafter described adhesive compositions and methods of using them are particularly useful for accurately mounting a magnetic head onto a suspension assembly arm, these adhesives and methods also can be used in a wide variety of other assembly situations where one electrical component must be mounted to another in a minimal amount of residence time in expensive equipment and with a minimal amount of electrical resistance between the two components. Hence, even though the application of the adhesives and methods of this invention are described in terms of a computer controlled optics system to determine the location of the geometric center of a read/write head in conjunction with the exact situs on the suspension assembly arm on which the head is to be mounted, there are many other possible applications. Obviously such a method has particular application anywhere a gluing operation is being carried out by expensive fixturing and alignment equipment under the control of a computer which guides an apparatus which mounts a first component to a precise location on a second component with the correct orientation. This advantage would of course still be present even if there were no requirement for minimal electrical resistance between the two components being affixed to each other.

In the case of our read/write head/suspensions arm assembly example, the arm can be fabricated with a pair of marking holes in accurately determined locations near the location on the arm to which the head is to be mounted. The location on the arm to which the head is to be positioned is intermediate the two marking holes and is identified by a downwardly projecting dimple that is formed in the arm at the time the arm and the two marking holes are formed. The center of a dimple is the point of the suspension arm onto which the center of the head must be when the head is attached to the arm.

At the beginning of the assembly operation in which the head is affixed to the arm, both the head and the arm are placed on a tool holder that holds the arm and the head in an initial spaced apart relationship. The tool holder need have only nominal accuracy since the precision with which the head is mounted onto the arm by the process of the present invention does not depend upon critical dimensional tolerances of the tool holder or of the arm or the head. The tool holder with the arm and head held in a spaced apart relationship is positioned under a microscope of a computer controlled optics system. The optics system scans and identifies the exact location of the two marking holes and the dimple. During this scanning operation, the optics system computes the situs of the centers of the two holes and the dimple. The optics system then defines an imaginary line connecting the centers of the two marking holes. This line may be considered to be an x axis which runs longitudinally the length of the assembly arm.

The optics system next determines the amount by which this x axis of the arm is offset from a horizontal reference line on a table comprising a part of the vision system and on which the tool holder containing the arm and the head rests. The x axis of the arm and the horizontal reference line of the table should ideally be parallel to each other. However, in most cases the x axis of the arm deviates from being parallel with the horizontal reference line of the table by a small angle termed theta 1. The optics system determines this angle theta 1 as well as the amount by which the x axis of the arm is offset from the horizontal reference line of the table.

The optics system also identifies the situs of the center of the dimple intermediate the two marking at a predetermined point on the x axis interconnecting the centers of the two marking holes. However, as a result of manufacturing tolerances, the dimple is often offset slightly from its ideal position. The amount by which the center of the dimple is offset vertically from the x axis is referred to as the y' offset. The amount by which the center of the dimple is offset horizontally from its ideal location is referred to as the x' offset.

At this point in the process, the computer controlled optics system has identified the x axis of the assembly arm, has determined the amount by which the x axis is offset from the horizontal reference line of the table and has determined the angular amount theta 1 by which the x axis is offset from being parallel to the horizontal reference line of the table. The computer controlled optics system has also identified an x' and y' offset for the dimple representing the amount by which the actual center of the dimple is offset from its idealized location of the dimple on the x axis of the arm.

The optics system next scans the head, which is rectangular, in order to compute the situs of its geometric center. It does this by a technique in which the four corners of the head are scanned and identified. Also, from a scanning of the two bottom corners of the head, the computer determines the amount by which the bottom end of the head, as defined by a line interconnecting the two bottom corners, is offset from being parallel to the horizontal reference line of the table. This angular amount is defined to be an angle of theta 2.

The head is next picked up by a moveable arm controlled by the computer. The table on which the tool holder rests is rotated in a horizontal plane by an angular amount representing the difference between the angle theta 1 and theta 2. Recall that theta 1 is the angular amount by which the x axis of the arm deviates from being parallel to the horizontal reference line of the table. Angle theta 2 is the amount by which the bottom end of the head deviates from being parallel to the horizontal reference line of the table. For example, if theta 1 is three degrees and theta 2 is two degrees, the table is rotated one degree in order to position the x axis of the arm and so that it is parallel to the bottom end of the head.

The computer controlled optics system next uses the various parameters it has measured to move the table and the arm so that the center of the dimple is moved to the position in which it must be to receive center of the head. These parameters include the amount by which the x axis of the arm is offset from the horizontal reference line of the table and the x' and y' variables which represent the amount by which the center of the dimple is offset from its idealized location on the x axis of the suspension arm. The optics system next scans the dimple again and to determine whether the center of the dimple actually is in the position it now should now be in. If the dimple is still offset from its idealized location, the table is moved in the appropriate direction so as to position the center of the dimple exactly where it needs to be to receive the head. Next, the arm holding the head is moved horizontally so that the center of the head is over the center of the dimple. The arm and the head is then lowered so that the center of the head is placed onto the arm over the center of the dimple.

Prior to placing the head and the suspension arm in contact, one or more drops of the herein disclosed quick-tacking adhesive compositions ("quick-tacking adhesive compositions") are placed in locations on the arm and/or on the head where the interface between the bottom surface of the head and the top surface of the suspension arm will take place. That is to say the head can be thought of as a first component and the suspension arm as a second component and it makes little difference to the overall concept of this invention whether the quick-tacking adhesive composition is applied to the first element, the second element or both elements.

However for reasons associated with minimizing undesirable spills in the application of the quick-tacking adhesive compositions of this invention, it will normally be preferable to apply said adhesive composition to the top surface of the lower component to which the bottom surface of the higher component is then mounted. Thus in our example a drop or two of the adhesive is preferably applied to the top of the suspension arm, most preferably in those regions adjacent to the dimple. The quick-tacking adhesive composition is then spread into an extremely thin layer. This spreading can be accomplished as a separate step before the mounting or as a part of the mounting operation. The read/write head is then mounted, preferably, from above, on to the top surface of the suspension arm.

Hence, the herein disclosed adhesive bonding method differs both physically and chemically from the prior art. Physically speaking, the prior art method places one or more strips of the prior art, high-solid-content adhesive compositions as fillets of adhesive composition such as those indicated as B and B' in the cross sectional view shown in FIG. 2. Generally speaking such a prior art fillet B will generally extend from point $b_1$ to point $b_2$ as shown in FIG. 3. Another similar adhesive fillet B' is shown extending along a line from $b_3$ to $b_4$. In such prior art fabrication methods, these fillets of high-solid-content composition would be laid down as strips from a dispensing device such as a syringe and then dried to an essentially completely cured or set up state. In other words, in the prior art fabrication technique, the "glue" constituting these fillets is completely dried while the head and suspension arm elements are still in residence in the extremely expensive optics system described herein to emphasize the complexities involved in achieving such desired levels of precision. As previously noted the curing of high-solid-content adhesives of the prior art would take several hours at room temperatures; hence curing is typically aided by the addition of heat to quickly cure and/or dry these adhesives as quickly as possible. Even so such bonding operations take several minutes.

It should be specifically noted at this point, that from both the chemical reaction and the electrical connection points of view, the drops of the prior art high-solid-content adhesives which are used to lay down fillets B and B' of high-solid-content adhesive are not applied to the interface between the bottom of the read/write head and the top surface of the suspension arm. They are applied strictly as "fillets" at the conjunction of the head's side surface and the top surface of the suspension arm. If these high-solid-content adhesives were applied at the interface of the bottom of the head and the top of the suspension arm they would tend to produce a relatively thick (the expression "thick" can be taken, for purposes of this patent disclosure to mean greater than about 5 thousandths of an inch), uneven, layer of adhesive which would exhibit an unacceptably high electrical resistance. Hence an unwanted charge would tend to build up on the head. Moreover even if the prior art high-solids-content adhesives were applied at the interface of a read/write head and a suspension arm, they would take just as long, usually 1 to 2 minutes, or even longer, e.g., 2.5 to 3.5 minutes, to completely cure, even under those high temperature conditions which will most quickly cure, but not otherwise damage, these high-solid-content adhesive materials. Hence, at best, use of the prior art high-solid-content adhesive, whether in the form of a fillet or an interface, would require at least 1 to 2 minutes residence time of these components in the fixture and controlled optics system while the adhesive permanently cured. Again, however, in practice, interface bondings of high-solid-content adhesives are simply not employed because they produce a sandwiched layer of adhesive material having an unacceptably high level of electrical resistance. As previously noted, a layer of material of high electrical resistance in this location tends to electrically isolate the head from the arm and allow potentially harmful electrical charges to build up on the head.

In response to all of the above noted problems, Applicants have developed certain quick-tacking adhesive compositions, and certain methods for using them, which ultimately result in strong bonds, greatly reduced electrical resistance between bonded components and greatly reduced "residence times" for electrical components being "tacked", "glued" or otherwise bonded to each other, especially while they are in residence in expensive assembly line equipment such as the computer controlled optics system which is used as the primary example to disclose the general principles of this application. Such adhesive compositions are particularly well adapted for "quick tacking" an "interface" between two electrical components which are later more "permanently" glued to each other while they are no longer in residence in the expensive equipment used to align and interface the electrical components. In other words, applicants have found that the hereinafter described adhesive formulations are especially well suited to quick tacking two electrical components to each other in relatively short times while the components are still in residence in an expensive piece of assembly line equipment such as a fixture and controlled optics system. These quick-tacking adhesive compositions are, in effect, sandwiched into an extremely thin (e.g., from a few microns to several thousandths of an inch), uniform, layer which allows for excellent electrical conductivity between two electrical components such as a read/write head and a suspension arm to which it is normally attached.

In their most preferred optical alignment applications such adhesive compositions are used to "tack" a magnetic read/write head to a suspension arm by applying a coating of said adhesive between their interface to form a "sandwiched", head/adhesive/arm structure and then subjecting the adhesive to a temperature of from about 205°–210° C. for about 5 to about 10 seconds while the components are "in residence" in an optical alignment device. That is to say that the adhesive compositions and bonding methods of this application will normally require only from about 5 to about 10 seconds to complete. Hence these compositions are referred to as "quick tacking" adhesive compositions. Obviously in an "assembly line" type manufacturing operation, a reduction of residence time in an expensive piece of equipment from at least 1 minute (and more likely from 2 to 3 minutes) to 5 to 50 seconds and more likely from 5 to 20 seconds or better yet from 5 to 10 seconds is a significant improvement in the economic utilization of such equipment. In other words the quick-tacking adhesive action of these compositions takes place in less than say one minute, e.g , in 5 to 10 seconds, and allows the "tacked together" components to be removed from the expensive aligning equipment without disturbing their precise, and expensively achieved, alignment so that the alignment equipment is again free to receive the next, incoming components which also need the services of said alignment equipment in order to be properly bonded to each other. In this context the expression "properly bonded" should be taken to mean that the elements are aligned and the adhesive composition has achieved a state of "tackiness" sufficient to hold the electrical components in that proper alignment when subjected to the mechanical forces needed to remove the then "bonded" pieces from the alignment equipment and to place them outside the alignment equipment for further processing. Such further processing may include just letting the "tacky" adhesive become hard by the passage of time and/or by the addition of more heat and/or by the use of further gluing operations such as providing a glue fillet at a junction of the two electrical components. After such a fillet is laid, the quick-tacking adhesive may further cure, but again while out of residence of the expensive optical alignment equipment.

Clearly then, this bonding method contemplates, and in many cases prefers, that the bonding or gluing action of these quick-tacking adhesive compositions be augmented by other subsequent bonding methods. Thus, for example, strips of those prior art, "high-solid-content" adhesives previously discussed which are not suited to forming electrical interfaces can be employed. Most preferably they will be used in the same fillet forms and locations as fillet strips B and B' shown in FIG. 2, e.g., they can be applied at the junction formed by the bottom edge of one of the faces of a read/write head and the top surface of a suspension arm. These second or augmenting adhesives may well produce a bonding of the two components which is much stronger than that produced by the herein disclosed quick-tacking adhesive. Again, however, the most important advantage of the herein disclosed methods is that the setting up or curing of the second or augmenting adhesive method (e.g., laying down a fillet of glue) does not have to take place while such components are in residence in an expensive piece of assembly line equipment.

In their broadest terms these quick-tacking adhesive compositions comprise a solid component which, in turn, is comprised of from about 60 to about 90 weight percent of a synthetic, solid resin and from about 10 to about 40 weight percent of a synthetic, flexible resin which are suspended in a liquid component which is comprised of from about 80 to about 98 weight percent of a solvent and/or diluent which is compatible (e.g., "compatible" should be taken to mean it does not produce any undesired chemical reactions between the resin and the solvent) with the resins and from about 2 to about 20 weight percent of a curing agent capable of curing the resins and wherein said solid component comprises only from about 10 to about 30 weight percent of the overall quick-tacking adhesive composition and the liquid component initially comprises from about 70 to about 90 weight percent of the overall quick-tacking adhesive composition just prior to the time the composition is "cured". Such curing will involve, aside from chemical reactions of the resins and the curing agent, driving off (e.g., by heat) the more volitile solvent component of the overall adhesive composition.

However, it should be specifically noted that just after their formulation, the herein disclosed quick-tacking adhesive compositions, among other things, have a much greater proportion of solvent and/or diluent than the prior art high-solid-content adhesive formulations. Thus for example, the quick-tacking adhesive compositions of this patent disclosure may have only from about 10 to 30 weight percent solids (and more preferably from about 10 to about 20 weight percent solids) while the "high-solid-content" adhesives of the prior art often have solid components which comprise over 90 weight percent of the overall adhesive compositions in which they are employed. Thus, the adhesive compositions of this patent disclosure can be dispensed more in the form or state of free flowing liquids rather than as vicious beads of glue. Such quick-tacking compositions tend to, especially under the heating conditions hereinafter described, form very thin layers of adhesive material which do not have an electrical resistance sufficient to allow an electrical charge to build up on one of electrical components, for example on a read/write magnetic head. To a large degree such thin layers are initially produced by the initial relatively liquid condition of the adhesive. However, the solvent or diluent in which the solid components, (e.g., epoxy resins) are suspended quickly evaporates, especially when heated in a manner condusive to becoming "tacky" in a very short period of time (e.g., in 5–20 seconds and more preferably in 5 to 10 seconds). In any event, the initially formulated adhesive compositions will easily "flow" into layers which are very "thin" (from about 2 micros to about 5 thousands of an inch) relative to those which can be formed from "high solid content" resins.

It should also be noted that both the "solid component" and the "liquid component" of these adhesive compositions each could be broken down into their constituent components and still be considered within the scope of the teachings of this patent disclosure. For example, the individual ingredients, i.e., the synthetic, solid resin and the synthetic, flexible resin could be separately packaged and only mixed at the time of formulation of the overall adhesive composition. Similarly, the individual ingredients of the liquid component, i.e., the solvent (or diluent) and the curing agent could be separately packaged and only mixed upon formulation of the overall adhesive composition. In the more preferred methods of this invention, however, the solid component (comprised of the solid resin and the flexible resin) is mixed with the liquid component (comprised of the solvent and the curing agent) just prior to the use of the resulting composition. Those skilled in this art will also appreciate that the term "solid" resin does not necessarily mean the resin is in fact in a solid state when it is first employed in the adhesive formulation. On the contrary many of the solid resins come in a liquid state and are only converted to solids under the action of a curing agent.

Speaking in more specific chemical terminology, the quick-tacking adhesive compositions of this invention are more preferably comprised of: (1) a synthetic, solid resin selected from the group consisting of an epoxy resin, an acrylic resin, a polyester resin, a phenol-formaldehyde resin, and/or a polyurethane resin, (2) a synthetic, flexible resin which is most preferably selected from the group consisting of carboxy terminated butadiene nitrile (CTBN), a modified carboxy terminated butadiene nitrile or epoxidized butadiene, which are preferably suspended in a liquid component comprising a solvent (for the purposes of this patent disclosure, the term "solvent" should be taken to include the term "diluent", neither of which undergoes any significant adverse reaction with the synthetic, solid resin and/or the synthetic, flexible resin) and (3) a curing agent selected from the group consisting of dicyandiamide, 3-dimethylaminoproplyamine and imidazole, when the solid resin is on epoxy resin.

It should also be specifically noted that the term "carboxy terminated butadiene nitrile (CTBN)", for purposes of this patent disclosure, also may be taken to include those materials which result from prereacting an epoxy resin with CTBN. Such resulting materials may often serve to produce a "toughened" quality in many of the preferred tack-cure adhesive formulations of this patent disclosure. That is to say that in many cases CTBN tends to segregate from epoxy resins upon heating. This gives an undesired "softening" effect. Moreover, CTBN tends to react relatively more slowly. In response to these conditions, applicants have found that a CTBN which is pre-reacted with an epoxy resin to form what applicants often refer to as a "modified" epoxy, which is extremely compatible with those epoxy resins otherwise employed in the products and/or processes of this patent disclosure. Epoxy terminated CTBN also crosslinks very effectively with such epoxy resins and cures much more rapidly than unmodified CTBN. In the same vein, formulations which include epoxized or expoxyterminated nitriles such as carboxy terminated butadiene nitrile (CTBN) may also contain carboxylated butadiene nitrile (CBN) in place of CTBN.

Most preferably the solvent is one which boils at temperatures between about 37° C. and about 150° C. at one atmosphere of pressure and most preferably such solvents are selected from the group consisting of (1) tetrahydrofuran, (2) a ketone selected from the group consisting of acetone, methyl ethyl ketone and methyl isobutyl ketone, (3) an aromatic selected from the group consisting of toluene, xylene and benzene and (4) an ester hydrocarbon such as ethyl acetate or hexane.

Again, such adhesive compositions, once formulated, are most preferably those capable of then curing to a state of tackiness capable of holding electrical components in alignment by curing conditions produced by temperatures ranging between about 25° C. and about 225° C. in a time frame from about 5 seconds to about 50 seconds and more preferably in a time frame of from about 5 seconds to about 20 seconds and most preferably in from 5 to 10 seconds.

It should also be noted that in some of the most preferred embodiments of this invention, these quick-tacking adhesive compositions will contain a solid component which is comprised of from about 60 to about 90 weight percent of an epoxy resin and from about 10 to 40 weight percent of carboxy terminated butadiene nitrile resin which is suspended in a liquid component comprising from about 80 to about 98 weight percent of tetrahydrofuran and from about 2 to about 20 weight percent of 3-dimethy-laminopropyline and wherein said solid component comprises from about 20 to about 30 weight percent of the quick-tacking adhesive composition and the liquid component comprises from about 70 to about 90 weight percent of the quick-tacking adhesive composition.

Thus, an adhesive composition for quick tacking an interface between two or more electrical components made according to this patent disclosure would preferably be comprised of a solid component having from about 60 to about 90 weight percent of a synthetic, solid resin and from about 10 to about 40 weight percent of a synthetic, flexible resin suspended in a liquid component having from about 80 to about 98 weight percent of a solvent and from about 2 to about 20 weight percent of a curing agent and wherein said solid component comprises from about 10 to about 30 weight percent of the adhesive composition and the liquid component comprises from about 70 to about 90 weight percent of said composition and the resulting composition is capable of being cured to a state of tackiness sufficient to hold the two or more electrical components together in from about 5 to about 50 seconds at a temperature ranging from about 25° C. to about 225° C.

Some of the most preferred embodiments of these quick-tacking adhesive compositions have even narrower ingredient ranges, for example their solid component will most preferably be comprised of from about 72 to about 78 weight percent of a solid epoxy resin and from about 22 to about 28 weight percent of say a carboxy terminated butadiene nitryl resin used as the "flexible" resin component which are all suspended in a liquid component comprising from about 90 to about 95 weight percent of say tetrahydrofuran used as a "solvent" which further comprises from about 5 to about 10 weight percent of a curing agent such as, for example, 3-dimethylaminapropylamine and wherein said solid component comprises from about 22 to about 28 weight percent of the quick-tacking adhesive composition and the liquid component comprises from about 72 to about 78 weight percent of the resulting quick-tacking adhesive composition.

LIST OF POSSIBLE INGREDIENTS

Synthetic, Solid Resins

When used in the above noted proportions, the chemical identify of the above noted ingredients (e.g., epoxy resins, acrylic resins, carboxy terminated butadiene nitrile, etc.) may vary considerably. By in large such resins are the so-called "synthetic" types, as opposed to so-called "natural" resins. For example, most commercial epoxy resins are diepoxides made from bisphenol A and epichlorohydrin, which are coreacted to an epoxy equivalent weight of 190 and a viscosity of 12,000 to 16,000 centipoise. Modification to a base resin usually consists of varying the epoxy equivalent weight or increasing the viscosity and pendant hydroxyl content. However, those skilled in the art will appreciate that by using other reactive ingredients, a wide range of different epoxy resins having properties considerably different from those of standard bisphenol A resins can be employed For example, use of Novalac resins results in higher heat stability and also higher viscosity. Generally speaking, use of diols and triols will give flexible epoxy resins with high impact resistance but lower heat resistance. Use of halogenated reactants results in an epoxy that is self-extinguishing when removed from a flame but which has a higher specific gravity and cost. Using multifunctional ingredients in the herein disclosed quick-tacking adhesive compositions generally will give resins with three or four epoxy groups. This results in more crosslinks during cure but reduces impact strength and increases cost.

On the other hand, use of cycloaliphatic reactants produces epoxy resins with superior electrical properties but with a reduced ability to be cured. Generally speaking, each different epoxy resin occupies a place in the adhesive field where its advantages can be utilized best and its limitations can be tolerated or designed around. This is also true with respect to applicants' quick-tacking adhesive compositions. That is to say it should again be noted that it is the use of the relatively low proportion of resin component, relative to the solvent component that most distinguishes applicants' quick-tacking formulations from the high-solid-content adhesive compositions of the prior art. The exact identify of the resins employed in our formulations is of lesser importance. For example, Table 1 lists many common commercial epoxy resins which may be used to formulate the quick-tacking adhesive compositions of this patent disclosure but again, they should be regarded only as representative examples, of the synthetic, solid resins of this patent disclosure. Again, this invention resides more in the relative proportions of the various ingredients, particularly in the context of a quick tacking of an interface between two or more electrical components.

TABLE 1

| Common Epoxy Resins Which Can Be Used As The Solid Resin Component Of These Adhesive Compositions | | |
|---|---|---|
| Average epoxide equivalent | Viscosity, centipoise or melt point, °C. | Typical Trademarks |
| Bisphenol A epichlorohydrin types: | | |
| 172–176 | 4,000–6,400 | DER, 332, EPI-REZ 508, Araldite 6004, ERL 2710 |
| 182–196 | 7,000–10,000 | Araldite 6005, EPI-REZ 509, EPON 826, ERL 2772, DER 330, EPOTUF 37-139 |
| 185–196 | 12,000–16,000 | EPI-REZ 510, EPON 828, ERL 2774, DER 331, Araldite 6010, EPOTUF 37-140 |
| 172–185 (modified) | 500–700 | EPON 815, DER 334, EPI-REZ 507, ERL 2795, Araldite 506, 507, and 509, EPOTUF |

TABLE 1-continued
Common Epoxy Resins Which Can Be Used As The Solid Resin Component Of These Adhesive Compositions

| Average epoxide equivalent | Viscosity, centipoise or melt point, °C. | Typical Trademarks |
|---|---|---|
| 180–195 (modified) | 4,000–9,000 | 37-130 EPON 820, EPOTUF 37-134, Araldite 502 |
| 196–208 | 16,000–20,000 | DER 337, Araldite 6020, EPON 830 |
| 232–278 | mp 30–45° C. | EPI-REZ 515, DER 337, Araldite 6040, EPON 834 |
| 385–510 | mp 60–75° C. | EPON 836, Araldite 6060, EPI-REZ 519 |
| 425–550 | mp 65–75° C. | DER 661, Araldite 7065, EPI-REZ 520, EPON 1001 |
| 550–700 | mp 75–85° C. | Araldite 7072, EPON 1002 |
| 875–1025 | mp 95–105° C. | Araldite 6084, EPI-REZ 530C, EpON 1004, DER 664, EPOTUF 37-304 |
| 1650–2000 | mp 113–123° C. | Araldite 7097, DER 667 |
| 2000–2500 | mp 125–135° C. | EPON 1007, Araldite 6097, EPI-REZ 540C |
| 2500–4000 | mp 145–155° C. | EPON 1009, DER 669, Araldite 6099, EPI-REZ 550 |
| Diol-triol types: | | |
| 90–200 | 30–200 | DER 736, EPON 812 |
| 300–350 | 50–100 | EPI-REZ 502, DER 732 |
| 400–455 | 2,000–5,000 | Araldite 508, DER 741 |
| Fatty-acid types: | | |
| 400–420 | 450–600 | EPON 871 |
| 700–750 | mp 30° C. | EPON 872 |
| Higher functionality types: | | |
| 172–179 | 1,400–2,000(52° C.) | Ciba EPN 1139, DEN 431 |
| 175–182 | 50,000 (52° C.) | Ciba EPN 1138, DEN 438 EPI-REZ 5155 |
| 190–220 1000–1400 | mp 70–90° C. | EPON 1031 ERL-2131 |
| 200 | mp 35° C. | Ciba ECN 1235 |
| 225 | mp 73° C. | Ciba ECN 1273 |
| 230 | mp 78–81° C. | Ciba ECN 1280 |
| 235 | mp 99° C. | Ciba ECN 1299 |
| Halogenated types: | | |
| 300–400 | mp 60–65° C. | EPI-REZ 5161, DER 542 |
| 455–500 | mp 70–80° C. | Araldite 8011 |
| 450–550 | mp 75–85° C. | DER 511, EPI-REZ 5163 |
| Cycloaliphatic epoxy-resin types: | | |
| 74–78 | 20 | ERL 4206, Araldite RD-4 |
| 140 | 350 | ERL 4221, Araldite CY 179 |
| 213 | 900 | ERL 4289, Araldite CY 178 |

Although epoxy resins are the most preferred synthetic, solid resins for the practice of this invention, other synthetic, solid resins (e.g., acrylic resins polyester resins, polyurethane resins, phenol-formaldehyde/resins) may also be employed. A representative listing of, and some of the considerations associated with certain of these other synthetic, solid resins are as follows:

Polyurethanes Resins: The urethane group is formed by a cross-linking reaction of a polyol with a disocyanate, e.g., HO—ROH + OCN—R'NCOHO(—R.0.CO.NH.R.NH —R.0.CO.NH.R.NH.CO.O—). Obviously, in using a diol and a di-isocyanate, a linear polymer is formed which has a repeating unit: [—R.0.CO.NH.R'.NH.CO. O—].

Those skilled in this art will appreciate that the above general formula implies a wide-ranging variety of polyurethanes which depends upon two major differences in the approach to their formation. Either a prepolymer can be formed as above and the proportions of the starting materials chosen to give either isocyanate or hydroxyl terminated chains which are later reacted in some different way in a curing reaction, or some other form of prepolymer can be made and terminated with a group containing an active hydrogen to react with a di-isocyanate or one of higher functionality. Other suitable prepolymers are polyesters, polylactones, polyethers, aminopolyethers, hydroxy terminated polydienes and a range of naturally occurring ester oils or their derivatives. They are also formed by cross-linking an isocyanate with an amine (e.g., R— N═C═O + R' NH$_2$ R.NH. CO. NH— R').

Phenol-Formaldehyde Resins: Phenolic resins form part of a range of very important adhesives. They are also important as tackifiers in a range of adhesive formulations, notably with polychloroprene contact adhesives. Hence they may well be used in the herein described quick-tacking adhesive compositions.

Phenol condenses with formaldehyde in the presence of either acid or alkali initially to form a methylol phenol and then a dimethylol phenol. The initial attack may be at the 2,4 or 6 position, but the product is such that the dimethylol is substantially 2,6 with only a small proportion of 2,4. If position 3 is substituted with methyl, reaction at 2,4 or 6 is still possible but if methyl, or more usually isopropyl or tert butyl is substituted at position 4, only position 2 and 6 are available for methylolation. The condensation product of para tert butyl phenol and formaldehyde is therefore a linear product which does not resinify by cross-linking. This structure is essential to its tackifying behavior, p-cresol similarly forms a linear, not a three dimensional resin and the cresylic resins resinify only because of the presence of o- and m-cresol. The presence of nucleophilic substitution in the para position not only limits methylolation to the 2,6 positions but it markedly reduces reactivity at these positions. Resorcinol, the meta dihydric phenol, on the other hand, easily methylolates in all three, 2,4 or 6 positions and hence resinifies very easily.

The second stage of the reaction involves the reaction of the methylol groups with further phenol and hence, with unsubstituted phenols, to form branched tree structures. With acid catalysis, in the presence of a deficit of formaldehyde, novolak resins are obtained. These have a largely branched but not cross-linked structure as no free methylol groups exist. To complete resinification, further formaldehyde, usually as hexamethylene tetramine, is added to methylolate and cross-link the resin. With alkaline catalysis and excess formaldehyde, resols are obtained of varying molecular size. The reaction between phenol, epoxy and CTBN or CBN also makes an excellent adhesive.

These compounds react initially to form dibenzyl ethers which, on heating lose formaldehyde and give a methylene linkage like the novolaks. In fact, the hardening reaction is not so simple as this since only about one half of the expected formaldehyde is liberated. There are also other reactions occurring at the same time. For example, loss of water from the dibenzyl ether can lead to quinone methides which trimerise into large ring structures.

The resorcinol resins obviously undergo a correspondingly complex series of reactions. However, their additional reactivity is such that equimolar proportions of resorcinol and formaldehyde will react at room temperature to form a novolak although the preparation of resorcinol novolaks is usually done in solution at somewhat elevated temperatures and in acid conditions. Phenol is usually present to extend the more expensive resorcinol and other phenols. Polyhydric phenols also have from time to time been proposed as extenders.

Resorcinol resins are cured by adding formaldehyde, usually as the powder paraformaldehyde, and they set quite smoothly at room temperature. Alternative to the use of paraformaldehyde is to take advantage of formaldehyde emission in the last stages of curing P/F (phenol/formaldehyde) resins.

Sugar (sucrose) can be used as an extender for the phenol formaldehyde reaction and hence used to modify the properties of the applicant's adhesives. The reaction presumably arises from the aldehydic reactivity of the sugar replacing part of the formaldehyde. Some experimentation may be need to determine optimum conditions for incorporating sugar and yet maintaining good adhesion. The prior art has, for example, noted that it is possible to replace about one-half by weight of the phenol in a straight P/F resin giving a formulation of 1 mole sucrose, 3–5 mole phenol and 9 mole formaldehyde.

Polyester Resins: Polyester resins may also be a useful synthetic, solid resins for the practice of this invention. They can be formed by condensing difunctional carboxylic acids with diols or by transesterification. The latter method is frequently used for the production of polyethylene terephthalate (PETP). Dimethyl terephthalate is reacted with ethylene glycol and the methyl alcohol recycled. A quite wide range of both difunctional acids and diols can be used in polyester products and frequently a mixed charge of several acids is used with the calculated proportion of diol. The diols tend to be simpler compounds but the acid moiety is drawn from very many classes of aliphatic and aromatic compounds though heterocyclics are rarely used.

Naturally occurring acids, or di-acids made by dimerising or polymerising materials such as linolenic acid (from linseed and other oils), linoleic (from castor oil) or tung oil (elaeostearic acid) are used in the production of certain polyester intermediates for polyurethanes and alkyd primers. Alkyd resins are polyesters derived from a polyfunctional alcohol, such as glycerol together with a dicarboxylic acid. They are used very extensively as a paint base but also can e used in the practice of this invention. Unsaturated acids are particularly used in the production of polyesters to be cross-linked by interpolymerisation with styrene. Such materials form the basis of glass reinforced plastics used for constructional purposes but are also marketed as high-solid-content adhesives.

Polycarbonates are sometimes used in hot melt adhesives but their principal interest to the adhesives technologist is the problem of joining parts made of polycarbonate. The most usual polycarbonate and one of the simplest is that based on bis-phenol A. They are less preferred for the production of applicant's quick-tacking adhesive compositions.

Acrylic Resins: Acrylates and Methacrylates may also be employed as the synthetic, solid component of the adhesives of this patent disclosure. The nominal structural formulae given for these resins cover a wide range of materials. In most formulas given, "R" represents either alkyl or aryl radicals. These two monomers represent a growing range of starting materials from which copolymers are being prepared for the adhesives industry, copolymers that will be designed for and used in almost every place where adhesives are now used except as structural adhesives for load bearing metal-to-metal structures. More polymerisation and copolymerisation studies have been made with these monomers than any other except styrene and this has borne fruit in the range of materials which can be easily prepared. Hence they too can be employed in the practice of this patent disclosure.

Polymethyl methacrylate (PMMA) itself is widely used as an adhesive when dissolved in a suitable solvent or else dissolved in its own monomer sometimes with a catalyst to bring about polymerisation though this is not strictly necessary. This use of monomer obviates the need to remove solvent as well as enabling earlier closing of impermeable joints. A small amount of plasticiser is usually added. These resins can also be employed as the solid, synthetic resin ingredient of the herein disclosed quick-tacking compositions.

Polyacrylic acid and polymethacrylic acid are, together with their salts, water soluble materials which can be used as adhesives but as homopolymers are rarely so used. Polybutylmethacrylate may be particularly useful, especially when used in conjunction with delayed action plasticisers such as dicyclohexyl- or diphenyl-phthalate.

Acrylate adhesives are drawn from the ranks of methyl acrylate 2-ethyl hexyl acrylate and heptyl acrylate but above all both acrylic acid and its esters are used in copolymerisation. Copolymers of these materials are prepared and used as emulsions or polymerised in bulk and used in solution. The comonomers and their relative proportions are chosen to give the desired rheological or tack qualities, to provide specific adhesion to given substrates or to possess chemically reactive groups that will lead to cross-linking when solvent or water is removed. Latices of partially cross-linked acrylate copolymers can be mixed with other emulsified polymers of the same family but which are not cross-linked to provide coatings for pressure-sensitive tapes of high cohesive strength.

Synthetic, Flexible Resins

In general, the solid resins such the above noted epoxy systems may be made more "flexible" by adding long-chain molecules to the mixture. These molecules are either nonreactive (plasticizers) or sparsely reactive (flexibilizers) with the solid resin component. This is also true of applicant's quick-tacking adhesive compositions. That is to say, the preferred forms of these quick-tacking compositions will contain from about 10 to about 40 weight percent of a synthetic, flexible resin as part of the 10–30% solid component of the overall adhesive composition. Epon 871 ® and aralclite 508 ® are particularly useful as the flexible resin component in the quick-tacking compositions of this patent disclosure. The reactive long chains of such flexible resins serve to provide internal molecular-chain flexibility, while nonreactive plasticizers tend to allow a measure of chain slippage and temporary distortion. Normally the reactive flexibilizers are much preferred in epoxy adhesives, since they are least likely to affect adhesive properties.

A flexibilizer or plasticizer may also impart some degree of resiliency, or toughness, which in turn may upgrade thermal and mechanical shock properties, increase impact resistance, improve peel and cleavage strengths, reduce internal stresses, decrease exotherm and shrinkage, and produce a better system for low-temperature or cryogenic bonding. It should be noted that some curing agents can also serve as flexibilizers. Again, the most preferred flexibilizing resins for the practice of this invention can be selected from the group consisting of carboxy terminated butadiene nitrile resins, epoxidized butadiene and modified carboxylated butadiene nitriles.

CURING AGENTS

Those skilled in this art will of course appreciate that resins usually must be converted (crosslinked or polymerized) from a liquid (thermoplastic) state to a tough, hard solid state (thermoset) by the addition of a chemically reactive compounds known as curing agents. In the most preferred versions of the adhesives of this patent disclosure, these curing agents will be presented to the other ingredients separately or more preferably as a part of the "liquid component" (the solvent and the curing agent) which is combined with the solid component (e.g., an epoxy resin) to formulate the overall adhesive composition. In any event, such a curing agent may be a true catalyst which induces a self-polymerization in the epoxy resin or a cross-linking compound which participates directly in the reaction and becomes chemically bound between resin chains. Other reactive chemicals also may be used to accelerate, promote, or retard these cross-linking reactions.

Those skilled in this art will appreciate that each different curing agent will result in a different cross-linked molecular structure when cured; and so each may have different properties from all the others given herein. For example, using a primary and secondary amine may give fast, tight cures, but the vapors may be sensitizing and the heat resistance may be low. On the other hand, amine adducts may give easier mixing ratios and reduced sensitizing potential but increase the viscosity. Polyamides may give excellent strength but lower heat resistance and chemical resistance. Aromatic amines generally will give long pot life and increased heat and chemical resistance, but they must be oven-cured and may be staining to the hands. Lewis acid complexes give fast-setting adhesives (within seconds) but are weak mechanically and difficult to use in production lines. Anhydrides give high temperature stability but the vapors are acidic and oven cures are required. In summary it can only be said that there are many, many curing agents available to the epoxy formulator, and each one may be best for only one particular use. Listings of some common curing agents which are especially well suited to curing epoxy resins and therefore which may be used in the practice of this invention appear in Tables 2, 2A, and 3. Again, as in the case of the use of the epoxy resins, it is the use of the relative proportions of these curing agents, in overall context of the relative proportions of the other ingredients, especially for the purpose of tacking electrical components, which constitutes the main teachings of this patent disclosure.

TABLE 2

Amine Curing Agents for Epoxy Resins

| Amine | Molecular Weight | Boiling Point, °C. |
|---|---|---|
| Ethylenediamine | 60 | 116 |
| Diethylenetriamine | 103 | 206 |
| Triethylenetetramine | 146 | 277 |
| Tetraethylenepentamine | 189 | 134 |
| Dimethylaminopropylamine (or 3- Dimethylaminopropylamine) | 102 | 134 |
| Diethylaminopropylamine | 130 | 169 |
| Monoethanolamine | 61 | 170 |
| p-p'-Methylenedianiline | 198.3 | 265 (25 mm) |
| Aminoethylpiperazine | 129 | 217 |
| Diaminodiphenylsulfone | 248 | 170 (mp) |
| Menthanediamine | 170 | 115 |
| Meta-xylylene diamine | 136 | 250 |
| Dicyandiamide | 84.08 | 210 (mp) |
| Polyamides | — | — |
| Polyamidoamines | — | — |
| Propylene oxide-amine adducts | — | — |
| Imidazole | | |
| Acrylonitrile-amine adducts | — | — |
| Diethanolamine | 105.14 | 268 |
| Piperidine | 85.15 | 106 |
| Pyridine | 79.10 | 115 |
| Benzyldimethylamine | 135 | 181 |
| Dimethylaminomethyl phenol | 151 | 100 (2 mm) |
| Meta-phenylenediamine | 108 | 60 (mp) |
| Tri-methyl amino methyl phenol | (DNP-30) | |

TABLE 2A

Special Purpose Anhydrides and Acids which are especially useful as Epoxy Resin Curing Agents

| Product | Approx. Eq. Wt | Viscosity/MP |
|---|---|---|
| Nadic Dianhydride | 165 | 120° C. |
| Benzo Phenone Dianhydride | 161 | |
| Cyclopentane Tetracarboxylic Acid Dianhydride | 105 | 220° C. |
| Pyromellitic Dianhydride | 109 | 287° C. |
| Benzo Pnenone Tetracarboxylic Dianhydrid3 | 161 | 236° C. |
| H.E.T. | 185 | 240° C. |
| Phthalic Anhydride | 150 | 130° C. |
| Tetrahydro Phthalic | 150 | 100° C. |
| Hexahydro Phthalic | 150 | 40° C. |
| Nadic Methyl Anhydride | 180 | 200[1] cps |
| Dodecenyl Succinic Anhydride | 270 | 200[1] cps |
| LA-1 | 150 | 100–200[1] cps |
| Maleic Anhydride | 100 | |
| Trimellitic Anhydride (TMA) | | |
| Succinic Anhydride (SA) | 100 | 120° C. |
| Araldite 916 | NS | 50–55 cps[1] |
| Epotuf 37 624 | | 500–100 cps[1] |

TABLE 3

Anhydrides and Other Miscellaneous Curing Agents

| Curing Agent | Molecular Weight | Melting Point, °C. |
|---|---|---|
| Anhydrides: | | |
| Phthalic | 148.11 | 132 |
| Maleic | 98.06 | 52 |
| Tetrahydrophthalic | 154.2 | 35 |
| Methyl nadic | 178.2 | 12 |
| Dodecenyl succinic | 266.4 | 12 |
| Nonyl succinic | 226 | 206 (16 mm) |
| Dichloromaleic | 167 | 118 (mp) |
| Chlorendic | 371 | 140 (mp) |
| Pyromellitic | 218 | 285 (mp) |
| Miscellaneous: | | |
| Boron trifluoride-monoethylamine complex | 113 | 89 (mp) |

SOLVENTS AND/OR DILUENTS

The solvents and/or diluents of this patent disclosure are used to initially lower the viscosity of solid resin system. The are of two types, reactive and nonreactive (see for example Tables 4 and 5 below). Reactive diluents are those which become permanently bound into the cured system and thus have the least degrading effect on properties. Nonreactive diluents do not react chemically with either the epoxy resin or the curing agent and therefore are more likely to alter the final properties of the resulting adhesive composition. The nonreactive solvents and/or diluents are preferred for the adhesive compositions of this patent disclosure. Although such solvents and/or diluents are primarily used to reduce viscosity, they may also be used for the following important reasons:

1. Increase or decrease impact and flexural strengths.
2. Increase or decrease high-temperature or low-temperature capabilities.
3. Improve or modify chemical resistance, electrical properties, and flame resistance.
4. Reduce or extend pot life; increase or decrease exotherm and extend storage life.

TABLE 4

Reactive Solvents and/or Diluents and Modifiers

| Name | Viscosity centipoise at 25° C. | Boiling Point °C. |
|---|---|---|
| Allyl glycidyl ether | 1 | 154 |
| Butyl glycidyl ether | 3 | 170 |
| Phenyl glycidyl ether | 6 | 245 |
| Cresyl glycidyl ether | 25 | 265 |
| Furfural alcohol | 5 | 170 |
| Butyrolactone | — | — |
| Triphenyl phosphate | 15 | 260 |
| Vinyl cyclohexene dioxide | 20 | 227 |
| Aliphati ($C_8$ to $C_{10}$) glycidyl ethers | 4 | — |

TABLE 5

Nonreactive Solvents and/or Diluents and Modifiers

| Name | Boiling point, °C. |
|---|---|
| Tetrahydrofuran | — |
| Various Ketones such as acetone, methyl ethyl ketone and methyl isobutyl ketone | — |
| Ester Hydrocarbons such as hexane and ethyl acetate | — |
| Dibutyl phthalate | 340 |

TABLE 5-continued

Nonreactive Solvents and/or Diluents and Modifiers

| Name | Boiling point, °C. |
|---|---|
| Dibutyl sebacate | 345 |
| Dioctyl phthalate | 386 |
| Chlorinated biphenyl | 390 |
| Polyethylene glycol | 300 |
| Coal tar | — |
| Pine oil | 215 |
| Petroleum oils | 290 |
| Methyl ethyl ketone | 79 |
| Aromatics such as: | |
| Toleune | 110 |
| Xylene | 144 |
| 2-Nitropropane | 120 |
| Dimethyl formamide | 153 |
| Butyl alcohol | 99 |
| Aromatics such as tolulene, xylene and benzene | |

Preferred Processes For Using These Compositions

Speaking in process terms, the herein disclosed quick-tacking compositions for "tack" bonding a first electrical component to a second electrical component are best employed by: (1) applying to the first component, a quick-tacking adhesive composition comprised of a solid component which is comprised of from about 60 to about 90 weight percent of a synthetic, solid resin and from about 10 to about 40 weight percent of a synthetic, flexible resin which are suspended in a liquid component which is comprised of from about 80 to about 98 weight percent of a solvent and from about 2 to about 20 weight percent of a curing agent and wherein said solid component comprises from about 10 to about 30 weight percent of the quick-tacking adhesive composition and the liquid component comprises from about 70 to about 90 weight percent of said quick-tacking adhesive composition; (2) allowing the composition to flow into a thin layer, (3) placing the first electrical component in bonding contact with the second electrical component via a sandwiched layer of composition while the two electrical components are placed in an "aligned" relationship to each other; (4) exposing the quick-tacking adhesive composition to a temperature of from about 205° to about 210° C. for a time period of from about 5 to about 50 seconds and most preferably from about 5 seconds to about 10 seconds and (5) removing the tacked components from the device used to align said electrical components. That is to say that in some of the most preferred embodiments of this invention the bonding action produced by the quick-tacking adhesive composition is made to form a sandwiched layer between a first electrical component (e.g., a read/write head) and a second electrical component (e.g., a suspension arm) while they are under the control of a fixture and controlled optics system of the type described in this patent disclosure.

In our head/suspension arm example, the above described bonding operation completes the assembly operation and at this time the center of the head is affixed to the idealized location on the arm. By employing such a "tacking" operation, the positioning of the head will be accurate with regard to rotational errors since the table was rotated so that the x axis of the arm is parallel to the bottom end of the head. Use of it in conjunction with a computer controlled optics system ensures that the read/write surface of the head is positioned so that the head will be exactly parallel to the surface of the magnetic medium with which it will subsequently cooperate. The bonding method and compositions of the invention positions the head on the arm accurately with tolerances that were heretofore unattainable by prior methods and which permit the head to operate in a trouble free manner with the disk with which it will subsequently be associated. The method of the present invention thereby overcomes and solves the above discussed problems of accurately mounting magnetic heads on suspension arms while in residence in an optical alignment device for periods of less than about 50 seconds. Indeed in most cases, the tack bonding operation can be completed in as little as 5 to 10 seconds. Thereafter, the bonding action of the herein disclosed quick-tacking adhesive compositions can be supplemented by other bonding operations such as use of fillets of the prior art high-solid-content adhesives applied to a junction of the first and second components.

DESCRIPTION OF THE DRAWINGS

These and other aspects of the invention may be better understood from a reading of the following description thereof taken in conjunction with the drawing in which:

FIG. 2 is a side view of the assembly arm of FIG. 1;

FIG. 3 illustrates the placement of head onto a dimple on the assembly arm of FIG. 1;

FIG. 4 is a top view of a tool holder containing an assembly arm and a head as well as the apparatus that moves the head;

FIG. 5 is a side view of the apparatus of FIG. 4;

FIGS. 8, 9, 10 and 11 illustrate the commands that are applied to the computer in accordance with the method of the invention.

DETAILED DESCRIPTION

The following detailed description relies heavily upon the example of mounting a read/write head to a suspension arms. Again, it should be emphasized that the quick-tacking bonding compositions of this patent disclosure, and the herein disclosed methods for employing them, can be utilized in many other assembly operations where one electrical component must be bonded to another. These detailed descriptions are also intended to illustrate context of high precision positioning of electrical components in which the bonding compositions and methods of this patent disclosure are particularly useful.

Figure 1:
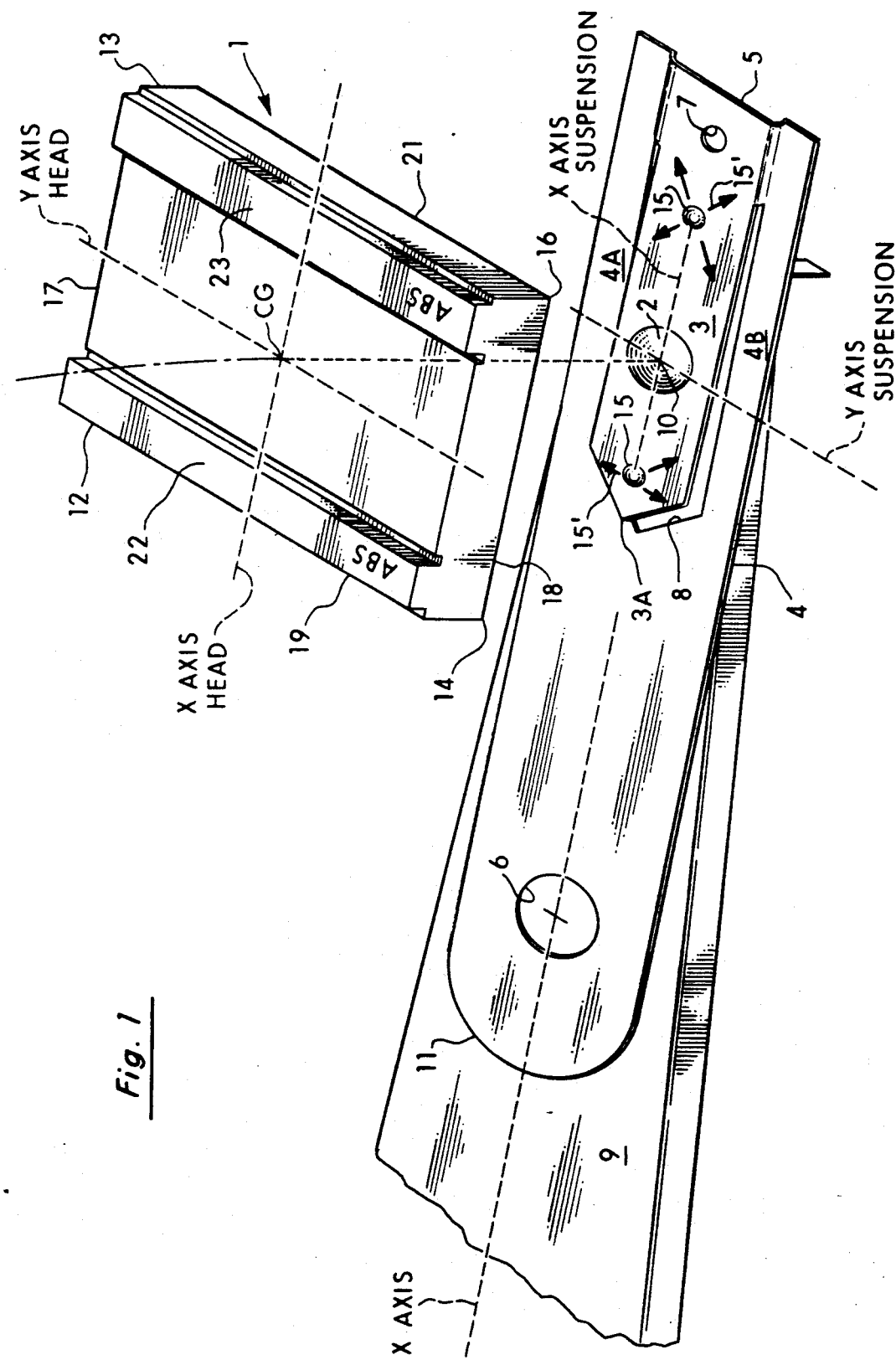
FIG. 1 illustrates a magnetic head positioned over a suspension assembly arm.

FIG. 1 discloses a magnetic head 1 positioned over a dimple 2 stamped in the end portion 4 of a suspension assembly arm 9. Head I is positioned so that its center of gravity cg is over the center of the dimple 2. An optical alignment apparatus positions the center of head 1 over the center of dimple 2 with the correct orientation of all aspects of the head. The apparatus then lowers head 1 onto element 4 and its flexure 3 in the correct orientation and then tacks head 1 to element 4 by means of an adhesive bonding operation. The expression "tacks" is used to indicate that this bonding operation holds the components in a desired physical relationship while they are in alignment equipment. Thereafter, a second bonding operation can be applied to the components after they are removed from residence in the expensive alignment equipment.

In any event, end element 4 which comprises an outer end 5, a small marking hole 7, a large marking hole 6, and a semicircular end portion 11. Element 4 is spot welded to arm 9 in the general vicinity of end 11 of element 4. Element 4 basically comprises a flat thin strip of metal which is fabricated to have a flexure 3 containing the circular dimple 2 and a pointed left end 3A. A void 8 extends around the perimeter of element 3 except at its right hand portion 5. Flexure 3 contains drops of adhesive 10.

The magnetic read/write head 1 is rectangular and has corners 12, 13, 14 and 16. These corners define an upper end 17 as shown on FIG. 1, a lower end 18, a left side 19 and a right side 21. A top left segment 22 and a top right segment 23 comprise the air bearing surfaces (ABS) of the head and contain the windings and gap of the portion of element 1 comprises the reading and writing elements of the head.

Head 1 is placed in the position as shown in FIG. 1 by the quick-tacking compositions and method of the present invention. At this intermediate stage of the process, the lower end 18 of the head is parallel to the x axis of arm 9. This x axis is a line drawn between the centers of holes 5 and 6. This parallelism is accomplished by rotating arm 9 horizontally the required amount. At this stage of the process, the center of gravity cg of head 1 is immediately over the center 10 of dimple 2. The final step of mounting head 1 to the center 10 of dimple 2 is to lower head 1 over dimple 2 and onto flexure 3 and then to join the head and the flexure by a quick-tacking adhesive bonding operation. Preferably, bonding is achieved by depositing drops of adhesive 15 on flexure 3. Since the quick-tacking bonding compositions of this patent disclosure are free-flowing liquids they tend to flow away from the spot 15 in the manner indicated by arrows $15^1$. Preferably the end result of this spreading action $15^1$ of the composition produces a very thin layer of the quick-tacking bonding composition (again, for the purposes of this patent disclosure the expression "thin" can be taken to mean from about 2 microns to about 5 thousandths of an inch) which generally underlies head 1 in a layer 15a as shown in FIG. 2. In other words layer 15a is sandwiched between the bottom of head 1 and the top surface of flexure 3. The quick-tacking compositions of this patent disclosure are intended to "tack weld" the head 1 to the flexure 3 in the precise orientation achieved by the optical alignment device. Thereafter, that is after the tacked components are removed from residence or association with the optical alignment equipment, the head 1 and the flexure 3 can be more permanently bonded to each other with a stronger, but slower curing adhesive, such as a high-solid-content adhesive known to the prior art, which may well produce a stronger bond than that produced by the quick-tack adhesive compositions of this patent disclosure, but which require much longer periods of time (e.g., 1 to 8 hours) to achieve. Such a supplemental bond can be applied as a fillet such as those indicated by B and B' in FIG. 2. Such fillets B and B' can be applied by those syringe-like dispensing devices which are used by the prior art to affix the head 1 to the flexure 3 by use of fillets of those high-solid-content ("100% epoxy resins") resins which, if used, take several minutes to cure while the components were in residence in the optical alignment equipment.

FIG. 2 is a side view of suspension arm 9 and its end element 4 of FIG. 1. Shown in further detail on FIG. 2 is dimple 2 which extends downwardly from flexure 3. The bottom most portion of the dimple rests on surface 9A of element 9 and between elements 4A and 4B (FIG. 1). The downward projecting right end 9B of arm 9 serves no function relevant to the invention.

FIG. 3 illustrates the mounting of head 1 on flexure 3 under two different assumed conditions. The first assumed condition is that the center 10 of the dimple 2 is located on correct location of the x axis of element 4. The second assumed condition is that the center 10 of dimple 2 is offset slightly to the left and slightly above its ideal location. End member 4 is spot welded near its left end portion 11 to the end portion of assembly arm 9 as shown on FIGS. 1 and 2. The left marking hole 6, the right marking hole 7, the flexure 3 and the dimple 9 are formed in element 4 prior to the spot welding operation. At that time, flexure 3 containing the dimple 2 is formed and sufficient material is removed by a stamping operation to form the void 8 having the dimple 2 and the pointed left end segments 8D and 8E as well as a lower horizontal segment 8A and an upper horizontal segment 8B. The void elements 8 permit flexure 3 to function as a spring that is pivoted on its right end 5 which forms a part of element 4. The bottom of dimple 2 rests on the top surface 9A of arm 9 and acts as a gimbal for head 1 after it is attached to the dimple.

The first stage in the process of the present invention is for the computer controlled vision system subsequently described in connection with FIGS. 6 to scan sequentially the left marking hole 6, the dimple 2, and the right marking hole 7. During this scanning operation, the vision system computes the location of the geometric centers of hole 6, hole 7, and dimple 2. The vision system next draws an imaginary line between the computed centers of holes 6 and 7. This imaginary line is the x axis of suspension arm 9. The vision system next determines the amount by which the x axis of arm 9 is offset from an imaginary horizontal reference line stored in the data base of the computer portion of the vision system. The computer also determines the amount by which the x axis of arm 9 deviates from being parallel to the horizontal reference line in the computer. The amount by which the x axis of arm 9 deviates from being parallel is termed angle theta 1.

The center 10 of dimple 2 should ideally be on at a predetermined location on the x axis of arm 9 between the centers of holes 6 and 7. It may sometimes occur in the stamping operation in which element 4 is formed that dimple 2 will be in this idealized location. In such cases, the center of dimple is located at location 10 shown on FIG. 3. This idealized dimple is shown by the solid circular line on FIG. 3. It is then the task of the apparatus and method of the present invention to determine the location of the center of gravity of head 1 and positioned it over and affixed it to the center 10 of the idealized dimple 2. However, due to tolerances associates with any manufacturing operation, the center of the dimple 2 will usually be offset a slight amount from its idealized location 10. This situation is shown on FIG. 3 for the dimple shown by dotted lines and having the center 10'. This dimple is slightly above and is slightly to the left of the dimple at the idealized center 10. The positioning procedure detects this offset of dimple 2 and places the center of gravity of a head 1 over the center 10' of the offset nipple.

After having scanned holes 6 and 7 and having defined the x axis of arm 9, the computer controlled optics system then scans the dimple and determines the situs of its center. In so doing the computer determines that the center of the dimple is in an offset location 10'. The location 10' is specified to be on a horizontal axis termed x' which is offset vertically with respect to the x axis of arm 9. Location 10' is further specified to be on a vertical axis y' which on FIG. 3 is offset to the left with respect to the y axis of the idealized dimple. After the head 1 and flexure 3 are completely aligned they are bonded by the quick-tacking adhesive compositions of this patent disclosure. Preferably the sandwiched layer 15a of quick tacking adhesive composition shown in FIG. 2 will flow into a relatively thin (e.g., 5 to 500 microns planar surface which underlies the bottom surface of the read/write head 1 generally in the region defined by points $b_1$, $b_2$, $b_3$ and $b_4$ in FIG. 3. Thereafter, when the components are taken out of residence of the optical alignment device, fillets of a second or supplemental bonding adhesive, such as those depicted by B and B' in FIG. 2, can be placed in those junctions between the head 1 and the flexure 3. Generally speaking this too would imply a fillet along the junction which extends from point $b_1$ to point $b_2$ and another fillet along the junction which extends from point $b_3$ to point $b_4$ in FIG. 3. In a preferred embodiment of this invention these supplemental fillets are comprised of high-solid-content adhesives such as those employed for this purpose in the prior method of affixing such components to each other.

FIGS. 4 and 5 discloses further details of a positioning method which may be employed with the herein disclosed quick-tacking compositions. Shown on FIGS. 4 and 5 are a tool holder 51 and computer controlled z-motion apparatus 38 having element 38A and 38B. As is subsequently described in detail, tool holder 51 holds suspension arm 9 and head 1 in an initial spaced apart relationship. Tool holder 51 cooperates with z-motion apparatus 38 so that the head 1 may be affixed to the center of flexure 3 in the precise orientation required for the head to operate successfully as part of the recording apparatus of which it will be a part. The right side of tool 51 holds head 1 in a transversely positioned groove 52. Head 1 is held only with reasonable precision within recess 52 by retainer posts 40. On the left side of tool 51, suspension arm 9 is held with only reasonable accuracy in a predetermined position. Posts 33 hold the end segment 4 of arm 9 with reasonable accuracy so that the dimple 2 is in the mid portion of opening 35 in tool 51. Opening 35 extends vertically through tool 51 and permits air from a heat source (shown on FIGS. 6 and 7) to be applied to the bottom of dimple 2 at the end of the assembly operation when it is desired to bond an adhesive to hold head 1 to flexure 3.

Suspension assembly arm 9 includes an upwardly tilted segment 24 on its left end as shown on FIG. 5. Segment 24 rests on upwardly tilted segment 53 of tool holder 51. A semicircular holding element 30 is rotatable about its center 29 by means of a groove 31 so that it may be rotated to the position shown on FIGS. 4 and 5 to project outwardly over the upward extremity of segment 24 of arm 9 to hold the left portion of the arm with reasonable accuracy in a predetermined position. Mounting posts 26 and 27 comprise a part of a table on which tool 51 rests and these posts hold the tool 51 with reasonable accuracy on the table.

The z-motion apparatus 38 cooperates with tool holder 51 to position head 1 accurately onto flexure 3. On FIGS. 4 and 5, arm 34 projects outwardly to the left from z-motion apparatus 38 so that its downward projection 36 (FIG. 5) is over head 1. The z-motion apparatus includes an upper movable part 38A and a lower stationary base part 38B. Part 38A is moveable with respect to the base 38B by means of a threaded element 41 which is rotatable to move element 38A either upwardly or downwardly on vertical guides 42. The z axis servo motor 39 is controllable to rotate threaded element 41 so that upper element 38A moves either upwardly or downwardly. Vacuum source 49 is controllable by valve 49A and computer 64 (FIG. 6) to apply vacuum to a hole in the bottom end of projection 36 of arm 34. Servo motor 39 controls the vertical position of element 38A. Arm 34 can move horizontally to the right or the left under control of air cylinder 50C. Cylinder 50C is controlled by air source 50 and air valve 50A. Arm 34 is shown in its left-most position on FIGS. 4 and 5 and at this time, the downward projection 36 of arm 34 is over head 1.

It is required at certain times in the process of the present invention that arm 34 move downwardly so that its downward projection 36 can pick up the head 1. Servo motor 39 is then energized and rotates screw 41 in the direction required to lower element 83A and arm 34 so that its downward projection 36 is adjacent the top surface of head 1. Vacuum value 49A next is actuated to create a vacuum via line 49B at the bottom of element 36. Since the bottom of element 36 is adjacent the top surface of head 1, the vacuum causes head 1 to be picked up and held to the bottom of element 36. After head 1 is picked up, servo motor 39 and the screw 41 are operated in the direction required to raise element 38A its arm 34. This moves head 1 upward and away from the top surface of tool 51. Cylinder 50C is actuated so that arm 34 and the attached head 1 are moved to the right.

Subsequently in the process, arm 34 is moved once again to the left by cylinder 50C. The table (FIG. 6 and 7) on which tool 51 rests is moved controllably to the right under the control of a computer so as to position the center of dimple 2 under the center CG of head 1 which remains affixed to the bottom of projection 36. Servo motor 39 and the screw 41 are again operated in the direction required to lower head 1 onto dimple 2. Flexure 3 is most preferably supplied with small drops of the quick-tacking adhesive 15 (FIG. 1) prior to the step of the process portrayed in FIGS. 4 and 5. Thereafter, a heat source (FIGS. 5 and 6) is actuated and blows air upwards through hole 35 against the bottom surface of the dimple 2. Flexure 3 is now in contact with the bottom surface of head 1. The heat source serves several functions. It aids the drops of quick-tacking composition to flow into a layer, it evaporates the liquid solvent or diluent component of the quick-tacking composition and it causes the bonding reaction to take place more rapidly than it would at ambient conditions. Preferably, the heat source remains actuated for the time required period to bond the adhesive sufficiently so that when the head source is deactivated, the head remains affixed to flexure 3 in the desired position and orientation. In other words, the head is "tacked" into the desired position on the suspension arm. Thereafter, the head and arm can be more permanently glued or otherwise affixed to each other.

Figure 6:
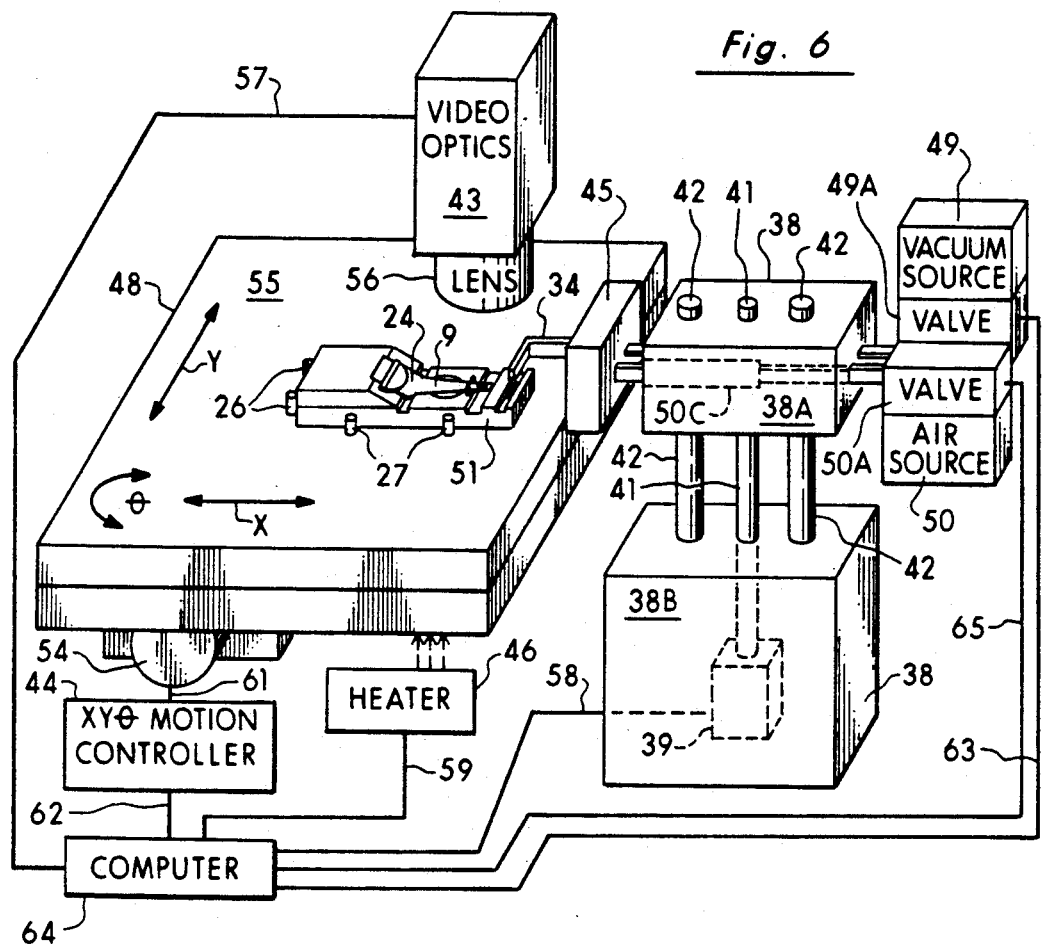
FIG. 6 is an perspective view of the apparatus used in accordance with the present invention.
Figure 7:
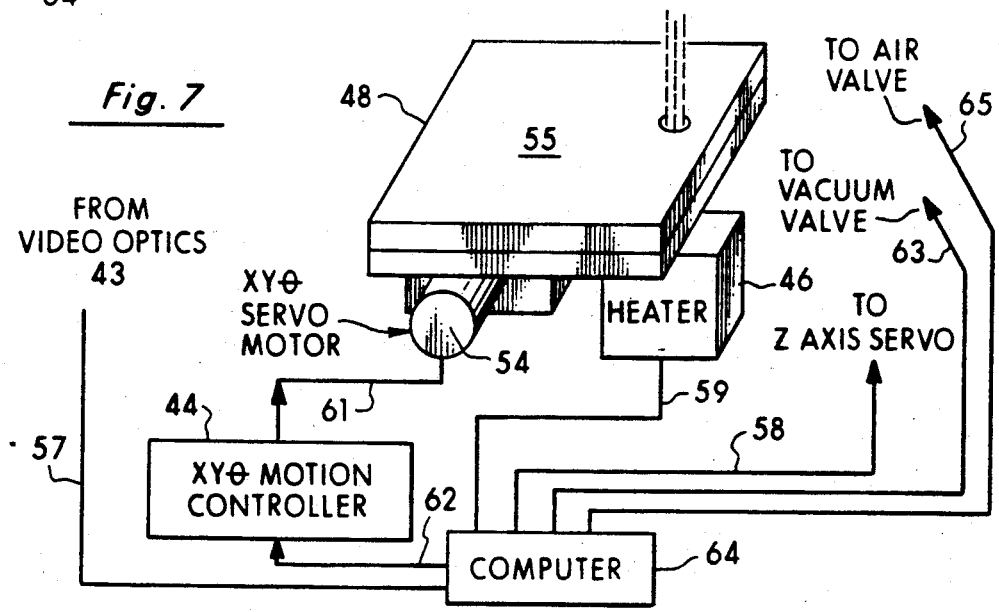
FIG. 7 illustrates further details of the apparatus of FIG. 6.

FIGS. 6 and 7 show further details of an apparatus which can be used to practice this quick-tack bonding method. Tool holder 51 rests on a top surface 55 of table 48. Tool holder 51 is held with nominal accuracy in a predetermined position on table 48 by upwardly projecting posts 26 and 27. The position of table 48 is controllable in an x and y direction by means of servo motor 54 and motion controller 44. Motor 54 may comprise three separate motors. With respect to FIGS. 6 and 7, table 48 can move to the right or to the left as well as backwards and forwards. Also, the table can be rotated horizontally by servo motor 54.

Tool holder 51 and suspension arm 9 and head 1 are shown positioned under a video optics system 43 having a lens element 56 which may be focused under control of computer 64 via path 57. Computer 64 and the video optics 43 comprises a sophisticated software controlled video robotic system. Computer 64 and servo motor 54 cause the position of table 48 to be controlled so that tool 51 can move in a controlled manner with respect to lens 56. This permits lens 56 and video optics 43 to scan various portions of the assembly suspension arm 9 as well as head 1. The positioning post 26 and 27 cause the tool holder 51 to be positioned on the table so that the arm 9 and head 1 are initially in the general vicinity required for these elements to be scanned by lens 56.

The following describes the manner in which the elements shown on FIGS. 6 and 7 cause head 1 to be positioned with precision onto dimple 2.

At the beginning of the process, head 1 and suspension arm 9 are in spaced apart positions on tool 51. The process begins when tool 51 containing suspension arm 9 and head 1 is positioned as shown on FIGS. 6 and 7 so that head 1 and arm 9 are generally in the vicinity of the working area of lens 56. At this time, tool holder 51 is positioned so that the working area of the lens is slightly to the left of marking hole 6 shown in better detail on FIGS. 1 and 2. Next, table 48 and tool holder 51 are to move to the left by servo motor 54 so that lens 56 and video optics 43 sequentially encounter hole 6, dimple 2, and hole 7. The video optics system 43 working in conjunction with computer 64 has the capability of identifying predetermined geometrical patterns such as circles and rectangles. It also has the capability of computing the center of a circle by scanning a left hand and a right hand circumferential segment of the circle. Thus, computer 64 and the video optics 43 now scan and compute the exact location of the center of circle 6, circle 7, and dimple 2.

Computer 64 next defines the x axis of arm 9 shown on FIGS. 1 and 3. The x axis is an imaginary line connecting the computed centers of holes 6 and 7. The computer 64 also contains information regarding an imaginary horizontal reference line which runs from left to right on FIG. 6 and which may be considered to be a horizontal reference on table 48. This horizontal reference may be anywhere on the top portion 55 of table 48 and its particular location is unimportant and irrelevant. However, generally, the horizontal reference may be assumed to be parallel to the direction in which the table top is moved when servo motor 54 effects a left/right movement of the table. Having determined the location of the x axis of arm 9, computer 64 next determines the distance by which the x axis is offset from the horizontal reference of the table. It also determines an angle theta 1 which represents the angular amount by which the x axis the arm 9 is offset from being parallel with the horizontal reference of table 48.

This information is stored in computer 64 for subsequent use.

Next, computer 64, having determined the exact location of the center 10 of the dimple 2, determines the amount by which the center of the dimple is offset from the idealized center of the dimple on the x axis of arm 9 as shown on FIG. 3. As previously discussed, let it be assumed that the design objective for element 4 specifies that location 10 on FIG. 3 is the center of an ideally located dimple. However, due to tooling and other errors, many elements 4 will have the dimple positioned so that there is a small offset between the actual center 10' of the dimple and the center 10 specified in the design objective. Let it be assumed that the part 4 now under analysis by the optic system 43 of FIG. 6 contains a dimple having a center 10' that is offset as shown on FIG. 3. This being the case, computer 64, since it has already computed and identified the location of the actual center 10' of the dimple 2, now determines a y' and x' offset for the center of the dimple. This represents the amount by which the actual dimple is offset in an x and y direction from the location the dimple would be in if it met the design objectives. This y' and x' information is stored in computer 64 for subsequent use.

Next, table 48 and tool holder 51 are moved to the left horizontally so that video optics system 43 and lens 56 scan head 1. The optic system 43 scans the rectangular head by sequentially scanning and identifying, the upper left hand corner, the lower left hand corner, the upper right hand corner and the lower right hand corner. Having scanned the four corners, and having been advised by its preprogrammed software that head 1 is a rectangle, computer 64 now computes the location of the center CG of the top surface of head 1. The controller also uses the computed information regarding location of the lower left hand and lower right hand corners of head 1 to characterize a line representing the lower side 18 (FIG. 1) of the head. Side 18 should ideally be parallel to the horizontal reference of the table but, in practice, will normally be offset therefrom by an angular amount of theta 2. This information regarding side 18 tells computer 64 the angular position in which head 1 currently rests on tool 51.

Next, arm 34 is moved to the left by element 47. Z axis servo motor 39 is now actuated by computer 64 so that screw 41 is turned in the manner required to lower element 38A until the bottom surface of element 36 is adjacent the top surface of head 1. At this time, vacuum valve 49A is actuated by computer 64 so that the vacuum created at the lower end of element 36 lifts head 1 and holds it affixed to the bottom surface of element 36. Servo motor 38 is now actuated to raise arm 34 and head 1. Arm element 34 is then moved with head 1 to the right under control of air cylinder 50C. Next, table 48 is rotated by the angular amount of theta 1 minus theta 2 to arm 9 so that the x axis of arm 9 is made parallel to the lower end 18 of head 1. Next, computer translates x' and y' information representing the offset of the situs 10' of the center of dimple 2. Table 48 is moved this amount to align the center 10' of dimple 2 so that it will be under the center of head 1 when arm 34 and head 1 is subsequently moved to the left.

Next, the vision system 43 remeasures the circular dimple to ascertain that the center 10' of the dimple is in the correct position on the table. If it is not, the table is moved in the required x and y manner to reposition the tool holder so that the center 10' of the dimple is in the required location. Next, arm 34 is moved to the left by cylinder 50C. Since the bottom surface of element 36 of arm 34 currently holds head 1 attached thereto by means of the vacuum from source 49, the center CG of the head is at this time immediately over the center 10' of dimple 2. Next, servo motor 39 is actuated to lower arm 34 and projection 36 the required amount so that the bottom surface of head 1 contacts the flexure 3 and adhesive 15 that has been priorly placed on flexure 3. The apparatus of FIGS. 6 and 7 is left in this position for a brief interval during which heater 46 is actuated by computer 64 to apply heat upwards to the bottom of dimple 2. This heats dimple 2 and causes the quick-tacking adhesive to assume a sufficient set to hold head 1 accurately in the position in which it has been placed by the apparatus of FIGS. 6 and 7. The vacuum source 49 is then deactivated, apparatus 38A is raised, and element 34 is moved to the right. Tool holder 51 now contains arm 9 and flexure 3 onto which head 1 has been accurately placed and bonded thereto by the heat cured adhesive 15. Thereafter, if need by, a secondary bonding such as the secondary fillets described in FIGS. 2 and 3 can be employed.

The following describes in further detail the computer controlled video optics system shown in FIGS. 4, 5, 6 and 7. This system comprises the entirety of the apparatus shown on FIG. 6 with the exception of the vacuum source 49, the vacuum valve 49a, the air source 50, the air valve 50a, the tool holder 51, and the suspension arm 9 and head 1 mounted on tool holder 51. The remainder of the apparatus of FIG. 6 comprises what is herein referred to as the computer controlled video optics system. This system is commercially available from the POLYCHECK Corporation as Model No. 9978-001-01-SP. The address of the POLYCHECK Corporation is OSI, 4281 Technology Drive, Fremont, Calif. 94538. The operation of this system is controlled by computer 64 which includes the hardware and software required to effect the required system operations and functions.

The software of computer 64 is provided by the POLYCHECK Corporation under the above identified model number. This software is of the menu driven type in that it responds to a plurality of different commands with each command being associated with a different system function. These commands are listed in the manual that accompanies the computer controlled video optics system. Each command is associated with a different system function and the transmission of the command to the computer together with coordinate information causes the system to perform the associated system function. The disclosed computer controlled video optics system performs the various operations associated with the method of the present invention in response to the reception of a plurality of system commands arranged in the sequence required to effect the method of the present invention.

Figure 8:
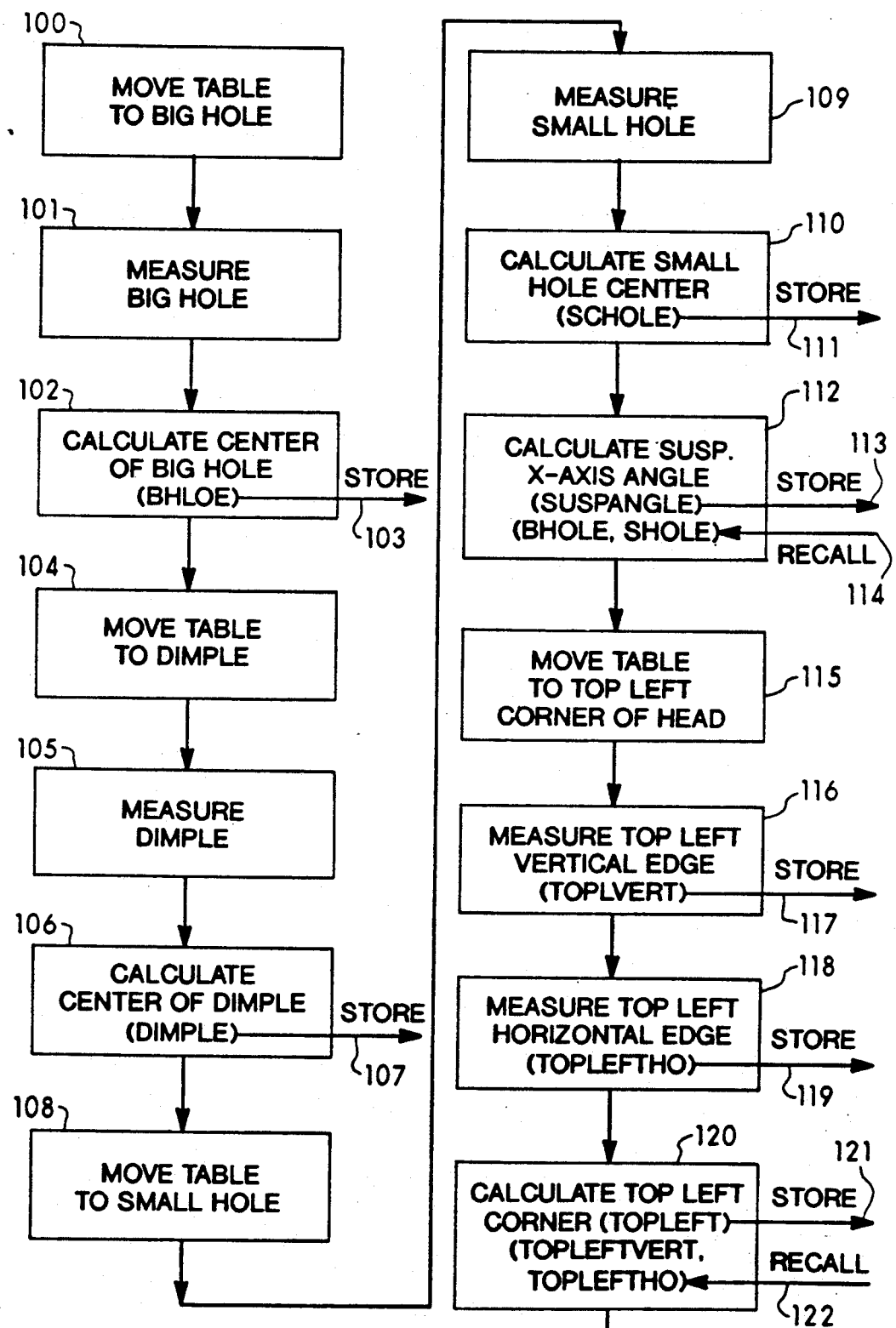
Figure 10:
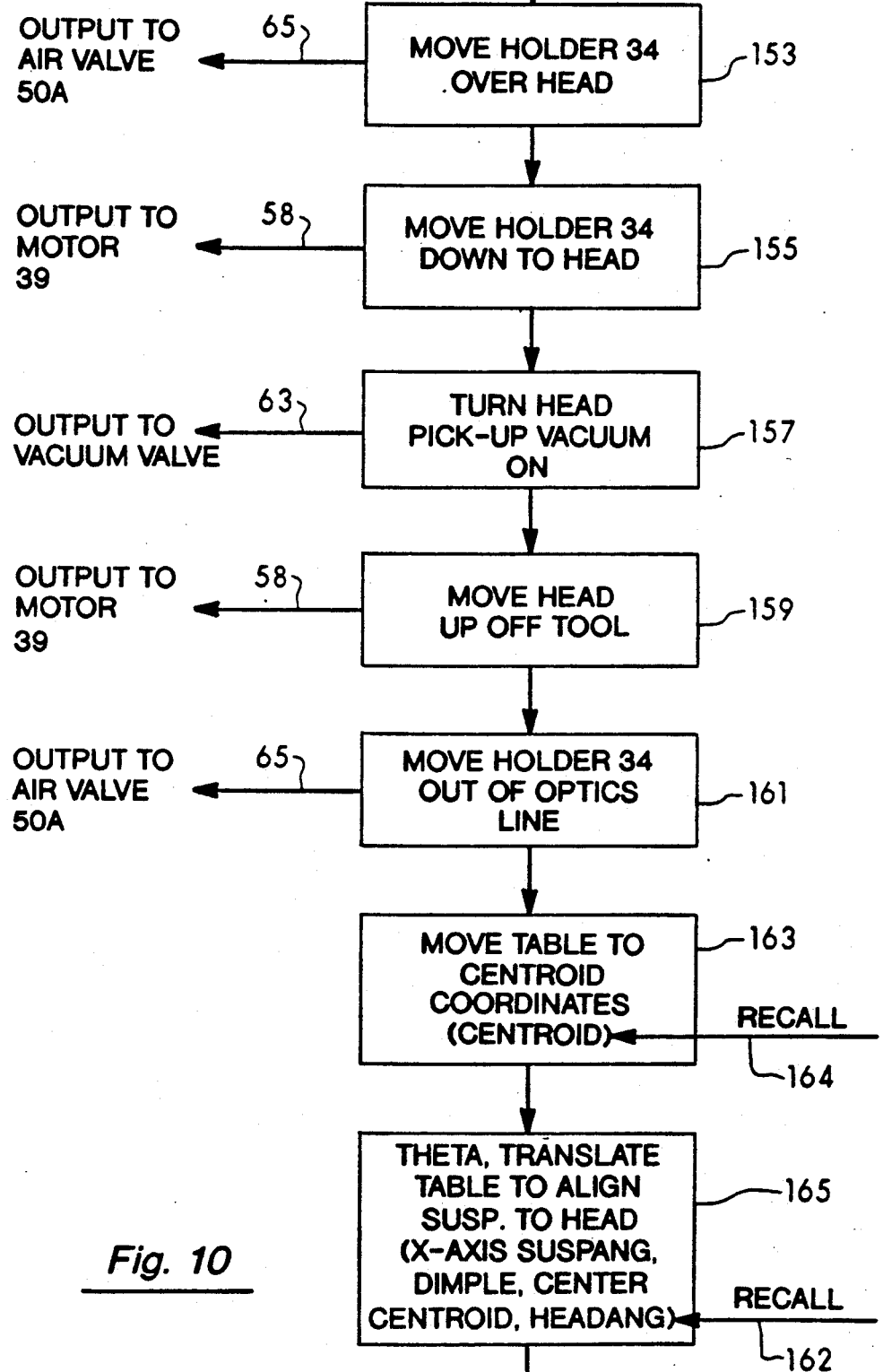
Figure 11:
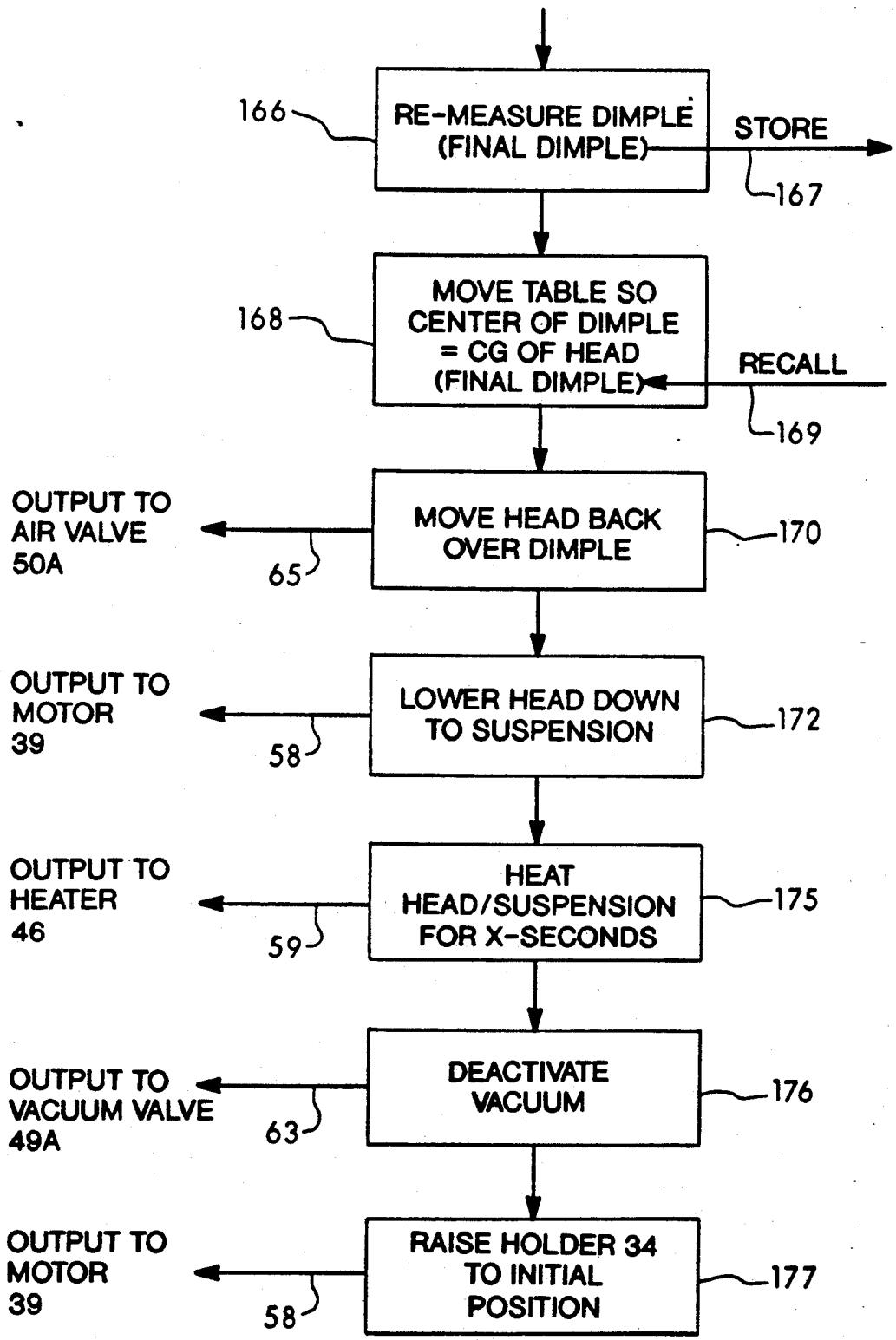

The following describes the sequence of commands that are transmitted to the menu driven computer controlled video optics system to cause it to perform the plurality of sequential steps that are required to practice the method of the present invention. This sequence of commands is shown in detail on FIGS. 8 through 11. The process begins on the top of FIG. 8 following the placement of tool holder 51 within the confines of posts 26 and 27 on the top of table 48. The process begins with element 100 in which computer 64 is commanded to move table 48 so that the video optics apparatus 43 and lens 56 can scan the big hole 6 on arm 9 as shown on FIG. 1. The process then moves to element 101 which commands the computer to measure the big hole. In measuring the big hole, the video optics apparatus 43 scans a plurality of segments of the circumference of hole 6. The process next moves to element 102 which commands the computer 64 to calculate situs of the center of the big hole. This calculation is performed using the information derived by element 101. The coordinates representing the situs of the center of the big hole are stored in memory in address BHOLE. This information is shown as being entered into memory via path 103.

The process advances to element 104 which transmits a move command to computer 64 to cause table 48 to move leftwards to the position in which video optics 43 and lens 56 scan the dimple 2. Next, element 105 causes the optics system 43 to measure dimple 2. This is done by identifying at least two segments of the circumference of the dimple. Next, the process advances to element 106 in which a calculate command is transmitted to computer 64 to cause it to calculate the situs of the center (FIG. 1) of dimple 2. Element 105 scans the dimple and segments of its circumference. Element 106 uses the information derived by element 105 to calculate the situs of the center of dimple 2. This situs information is transmitted over path 106 and stored in memory in an address referred to as DIMPLE. In element 109, table 48 is moved by computer 64, motion controller 44, and motor 54 to the position in which video optics system 43 can scan the small hole 7 of FIG. 1. The process next advances to element 109 which causes optics system 43 and computer 64 to measure small hole 7 by scanning segments of its circumference. Element 110 uses the information derived by element 109 to calculate the situs of the center of the small hole. This situs information is transmitted over path 111 to computer 64 and stored in memory location SHOLE. The process then advances to element 112 which calculates the angular amount by the which the x axis of suspension arm 9 is offset with regard to an imaginary horizontal reference line on table 48. Element 112 performs this function by receiving the coordinate information for the big hole and the small hole over path 114. It uses this information to define the x axis which is an imaginary line interconnecting the centers of these two holes. It then uses the x axis information to derive the angular information indicating the angular amount by which the x axis of arm 9 deviates from being parallel to the reference horizontal line of the table. This angular information is transmitted path 113 and stored in memory location SUSPANGLE.

Next, element 115 causes the table to move to the left so that optic system 43 can scan the top left corner of head 1 of FIG. 1. Information identifying the top left corner of head 1 is derived by elements 116, 118 and 120. Element 116 causes optic system 43 to scan and identify the location of the top left vertical edge 19 of the head. This information is transmitted over path 117 to memory and stored in location TOPLVERT. Element 118 causes the optic system to identify the situs of the top left horizontal edge 17 of the head. This information is transmitted over path 119 to the memory of computer 64 and stored in memory location TOPLEFTHO. Element 120 receives over path 122 the information derived by elements 116 and 118 and derives coordinate information identifying the situs of the top left corner 12 of the head. This coordinate information is transmitted over path 121 to memory and stored in location TOPLEFT.

At this stage of the process, the coordinates of the situs of the top left corner 12 of head 1 has been identified and stored in memory of computer 64. Next, element 123 moves table 48 to a position in which video optics 43 can scan the top right corner area 13 of head 1. Information identifying the situs of this corner is derived by elements 124, 126 and 128. Element 124 causes the system to measure the situs of the top right vertical edge 21 of head 1. This situs information is stored in memory location TOPRVERT via path 125. Next element 126 causes the system to measure and identify the situs of the top right horizontal edge 17 of head 1. This situs information is stored in memory location TOPRHO via path 127. Element 128 receives the information derived by elements 124 and 126 over path 130 and calculates the coordinates of the situs of the top right corner 13 of head 1. This situs information is stored in memory location TOPRIGHT via path 129.

Next, element 131 moves table 48 to the position in which video optics 43 can scan the bottom right corner 16 area of head to derive information regarding the situs of the bottom right corner. This information is derived by elements 132, 134 and 136. Element 132 causes the system to identify any situs of the bottom right vertical edge 21 of the head. This information is stored in memory location BOTRVERT via path 133. Element 134 causes the system to measure the situs of the bottom right horizontal edge 18 of head 1. This information is stored in memory location BOTRHO via path 135. Element 136 receives over path 138 the information derived by elements 132 and 13 and calculates the situs of the bottom right corner 16 of head 1. This situs information is stored in memory location BOTRIGHT via path 137.

Next, table 48 is caused by element 139 to move to the position in which video optic system 43 can scan the general area of the bottom left corner 14 of head 1. Information pertaining to this corner is derived by elements 140, 142 and 144. Element 140 causes the system to derive information regarding the situs of the bottom left vertical edge 19 of head 1. This information is stored in memory location BOTLVERT via path 141. Element 142 causes the system to derive information regarding the situs of the bottom left horizontal edge 18 of head 1. This information is stored in memory location BOTLHO via path 143. Element 144 receives over path 146 the information derived by elements 140 and 142 and calculates the situs of the bottom left corner 14 of head 1. This information entered into memory location BOTLEFT via path 145. Next, element 147 causes the system to derive information indicating the angular amount by which the x axis of the head is offset from being parallel with respect to the horizontal reference line of table 48. Element 147 performs its function by receiving information over path 148 identifying the coordinates of the bottom left and bottom right corners 14 and 16 of head 1. It then defines a line interconnecting these two corners. Because of accurate machining of the head in its fabrication, this line is presumed to be parallel to the x axis of the head shown on FIG. 1. Element 147 uses this information and the information regarding the horizontal reference line of table 48 to derive the information indicating the angular amount by which the x axis of the head is offset from parallel with the horizontal reference line of the table. This angular information is transmitted over path 149 and stored in memory location HEADANG.

Next, element 150 calculates the coordinates of the center cg of head 1 as shown on FIG. 1. It does this by first receiving over path 151 information identifying the coordinates of the four corners of the head. It uses this information to calculate the coordinates of the center cg of the head. This information is stored in memory location CENTROID via path 152.

Next, element 153 causes the system to activate air valve 50A so that holder 34 is moved to the left and positioned over head 1. This action is accomplished via path 65 which, as shown on FIG. 6, extends from computer 64 to air valve 50A and which causes the air valve to assume the operative position in which holder 34 is moved to the left by cylinder 50C. Element 155 causes the system to actuate motor 39 of FIG. 6 to move the bottom projection 36 of element 34 downwards as shown on FIG. 5 so that it is immediately adjacent the top surface of head 1. This action is accomplished by computer 64 applying a signal to path 58 to cause motor 39 to turn element 41 in the direction required to lower element 34. Element 157 activates vacuum valve 49A to cause the bottom projection 36 of element 34 to pick up head 1. This action is accomplished when computer 64 applies a signal to path 63 to actuate vacuum valve 49A so that vacuum may be extended via vacuum line 49B on FIG. 5 to produce a vacuum at the bottom surface of element 36. This picks up head 1 and firmly affixes it to the bottom surface of element 36.

Element 159 causes head 1 and element 36 to be moved upwards and away from tool 51. This action is accomplished when computer 64 applies the signal required over path 58 to cause motor 39 to move apparatus 38A and elements 34 and 36 upward. Element 161 causes the system to move holder 34 and its projection 36 and head 1 to the right so that it is out of the view of lens 56 and optic system 43. This action is accomplished by computer 64 applying the signal required to line 65 to close air valve 50A so that elements 50D, 45, 34 and 36, together with head 1, move to the right as shown on FIG. 5. At this time, head 1 has been picked up by the bottom surface of element 36, moved upwards away from tool 51 and then moved to the right so that it is out of the line of vision of lens 56 and video optics 43.

Next, element 163 receives over path 164 from memory the coordinates of the center cg of head 1. Element 163 causes table 48 to be moved to the location in which the center of dimple 2 is in the general vicinity of the coordinates representing the situs of the center cg of head 1 prior to the time the head was picked up by element 36. Next element 165 causes the system to derive the information required to align the suspension arm 9 so that its x axis is parallel to the x axis of head 1. It achieves this function by receiving information over path 166 identifying the angle of the x axis of suspension arm 9, the coordinates of the center of the dimple, the coordinates of the center of the head 1, and the angle by which the x axis of the head is offset from parallel with the horizontal reference line of the table. After having received the information over path 166, element 165 causes the system compute the angular amount by which table 48 should be rotated so that the x axis of arm 9 is parallel with the x axis of head 1 which is now attached to the bottom surface of element 36. Element 165 also causes motor 54 to move table 48 as required so that the center of dimple 2 is at the same coordinate position as the computed center cg of head 1 prior to the time it was moved by element 36.

Next, element 166 causes the system to scan the dimple again to compute the coordinates of the current situs of the center of dimple 2. This information is stored in memory location FINALDIMPLE via path 167. Element 168 receives the information derived by element 167 and causes the table 48 to be moved so that the center of dimple 2 is moved to the correct coordinates. This moves tool 51 to the position in which the center of dimple 2 is in the same position as was the center cg of head 1 prior to the time that head 1 was picked up and moved away by the vacuum at the bottom of element 36. Next, element 170 causes holder 34 and its element 36 and head 1 to move back to the left so that the center cg of the head is over the center 10 of the dimple. This action is accomplished by applying a signal from computer 64 over path 65 to actuate the air valve 50A and cylinder 50C. Next, element 172 causes head 1 to be lowered until it contacts flexure 3 with the center cg of the head being at the same table coordinates as is the center 10 of dimple 2. This action is accomplished by the computer 64 applying the signal required to path 58 to cause motor 39 to lower apparatus 38A including elements 34 and 36. At this time, head 1 is contacting the flexure 3 with the center cg of head 1 being immediately over the center of the dimple and with the x axis of the head being parallel to the x axis of suspension arm 9.

Next, element 175 causes the heater 46 to be activated for the period of time required to cause the drops of glue 15 on FIG. 1 to bond head 1 permanently to flexure 3. This action is accomplished when the computer 64 transmits a signal over path 59 to activate the heater. The heater is subsequently deactivated by the same path after the expiration of the time required to bond adhesive 15. Element 176 deactivates vacuum valve 49A so that the head 1 is no longer firmly affixed to the bottom surface of element 36. This is accomplished when computer 64 transmits the signal required over path 63 to turn of vacuum valve 49A so that a vacuum no longer exists at the bottom surface of element 36. Finally, element 177 causes the system to transmit a signal from computer 64 over path 58 to operate motor 39 so that it raises apparatus 38A and holder 34 and element 36 upwards to its initial position in which it is spaced apart vertically from head 1 which is now permanently affixed to flexure 3 of arm 9 in a precise alignment with respect to all parameters.

It can thus be seen, that the quick-tacking adhesive compositions and bonding methods of the present invention provide means of easily and accurately positioning or mounting two or more electrical components to each other. They are especially suited to mounting a read/write head on a suspension assembly arm.

While preferred embodiments of the present invention have been shown, it is to be expressly understood that modifications and changes may be made thereto and that the present invention is set forth in the following claims.

Thus having disclosed this invention, what is claimed is:

1. A method for bonding a first electrical component to a second electrical component, said method comprising:
   (1) applying to a surface of said first electrical component an adhesive composition comprised of a solid component having from about 60 to 90 weight percent of a synthetic, solid resin and from about 10 to about 40 weight percent of a synthetic, flexible resin suspended in a liquid component having about 80 to about 98 weight percent of a solvent and from about 2 to about 20 weight percent of a curing agent and wherein said solid component comprises from about 10 to about 30 weight percent of the adhesive composition and the liquid component comprises from about 70 to about 90 weight percent of said composition;

(2) placing the surface of the first electrical component to which the adhesive composition was applied in bonding contact with the second electrical component in such manner that the adhesive composition is sandwiched between the surface of the first component and a surface of a second component which is to be bonded to the surface of the first electrical component;

(3) placing the first electrical component in a desired alignment with the second electrical component in an apparatus used to achieve the desired alignment;

(4) subjecting the adhesive composition to a temperature of from about 35° C. to about 220° C. for a time period of from about 5 seconds to about 50 seconds in order to place the adhesive composition in a state of tackiness sufficient to bond the first electrical component to the second electrical component with a force sufficient to hold the first and second electrical component with a in a desired alignment while the bonded components are being removed from the apparatus used to achieve the desired alignment, and (5) removing the bonded components from the apparatus used to achieve the desired alignment.

2. The method of claim 1 which further comprises application of a fillet of a high solid content resin adhesive to a junction of said first and second components.

3. The method of claim 1 which further comprises application of a fillet of a high solid content resin adhesive to a junction of said first and second components and application of heat to said fillet of the high solid content resin adhesive.

* * * * *